(12) United States Patent
Lin et al.

(10) Patent No.: US 11,532,523 B2
(45) Date of Patent: Dec. 20, 2022

(54) GAPFILL STRUCTURE AND MANUFACTURING METHODS THEREOF

(71) Applicant: Taiwan Semiconductor Manufacturing Co., Ltd., Hsinchu (TW)

(72) Inventors: Sung-En Lin, Hsinchu (TW); Chi On Chui, Hsinchu (TW); Fang-Yi Liao, Hsinchu (TW); Chunyao Wang, Zhubei (TW); Yung-Cheng Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 17/197,925

(22) Filed: Mar. 10, 2021

(65) Prior Publication Data

US 2022/0051950 A1 Feb. 17, 2022

Related U.S. Application Data

(60) Provisional application No. 63/064,542, filed on Aug. 12, 2020.

(51) Int. Cl.
*H01L 21/8238* (2006.01)
*H01L 21/28* (2006.01)
(Continued)

(52) U.S. Cl.
CPC ............ *H01L 21/823878* (2013.01); *H01L 21/28088* (2013.01); *H01L 21/764* (2013.01);
(Continued)

(58) Field of Classification Search
CPC ....... H01L 21/823878; H01L 21/28088; H01L 21/76224; H01L 21/764; H01L 21/823814; H01L 21/823821; H01L 21/823842; H01L 21/823864; H01L 21/823871; H01L 27/0924; H01L 29/0649; H01L 29/4966;
(Continued)

(56) References Cited

U.S. PATENT DOCUMENTS 8,962,400 B2 2/2015 Tsai et al.
9,093,514 B2 7/2015 Tsai et al.
(Continued)

*Primary Examiner* — Karen Kusumakar
*Assistant Examiner* — Adam S Bowen
(74) *Attorney, Agent, or Firm* — Slater Matsil, LLP

(57) ABSTRACT

A method includes patterning a trench and depositing a first insulating material along sidewalls and a bottom surface of the trench using a conformal deposition process. Depositing the first insulating material includes forming a first seam between a first portion of the first insulating material on a first sidewall of the trench and a second portion of the first insulating material on a second sidewall of the trench. The method further includes etching the first insulating material below a top of the trench and depositing a second insulating material over the first insulating material and in the trench using a conformal deposition process. Depositing the second insulating material comprises forming a second seam between a first portion of the second insulating material on the first sidewall of the trench and a second portion of the second insulating material on a second sidewall of the trench.

20 Claims, 27 Drawing Sheets

(51) Int. Cl.
*H01L 21/762* (2006.01)
*H01L 21/764* (2006.01)
*H01L 27/092* (2006.01)
*H01L 29/06* (2006.01)
*H01L 29/49* (2006.01)
*H01L 29/66* (2006.01)
*H01L 29/78* (2006.01)

(52) U.S. Cl.
CPC .......... *H01L 21/76224* (2013.01); *H01L 21/823814* (2013.01); *H01L 21/823821* (2013.01); *H01L 21/823842* (2013.01); *H01L 21/823864* (2013.01); *H01L 21/823871* (2013.01); *H01L 27/0924* (2013.01); *H01L 29/0649* (2013.01); *H01L 29/4966* (2013.01); *H01L 29/66545* (2013.01); *H01L 29/66795* (2013.01); *H01L 29/7851* (2013.01)

(58) Field of Classification Search
CPC ......... H01L 29/66545; H01L 29/66795; H01L 29/7851; H01L 21/823481; H01L 29/165; H01L 29/785; H01L 29/7848; H01L 21/823431; H01L 27/0886
See application file for complete search history.

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2008/0268612 A1 | 10/2008 | Cho et al. | |
| 2012/0264268 A1 | 10/2012 | Lee | |
| 2012/0315738 A1 | 12/2012 | Kobayashi | |
| 2015/0091127 A1* | 4/2015 | Lee | H01L 27/10894 257/506 |
| 2019/0157407 A1* | 5/2019 | Singh | H01L 27/0924 |
| 2020/0105604 A1 | 4/2020 | Lin et al. | |

\* cited by examiner

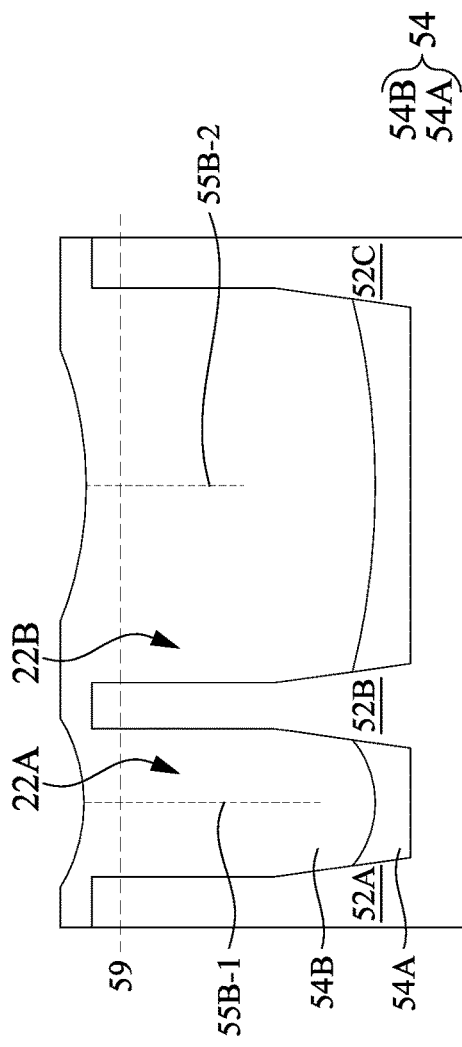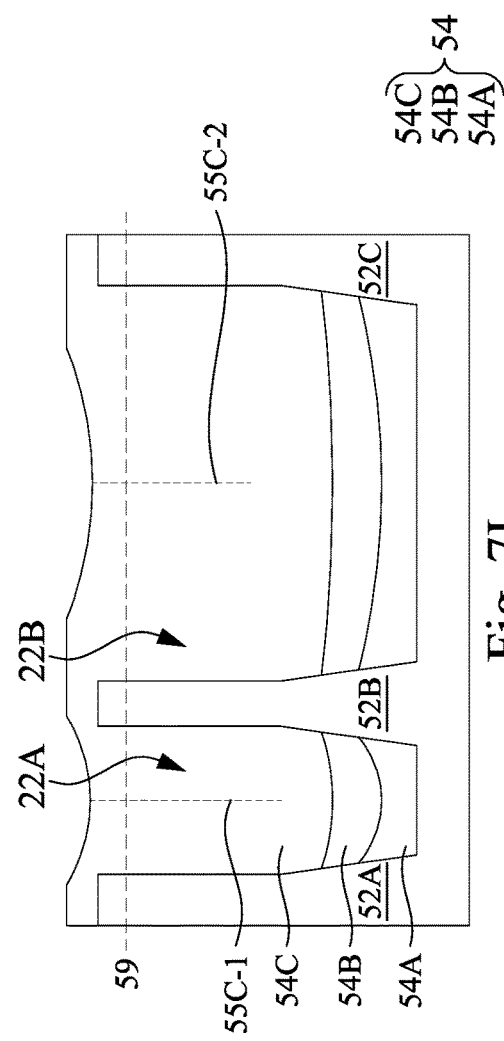

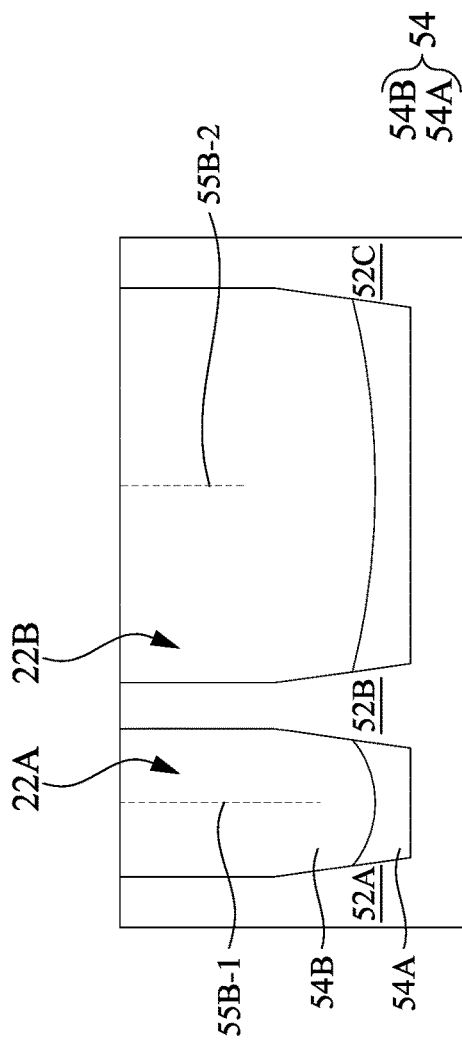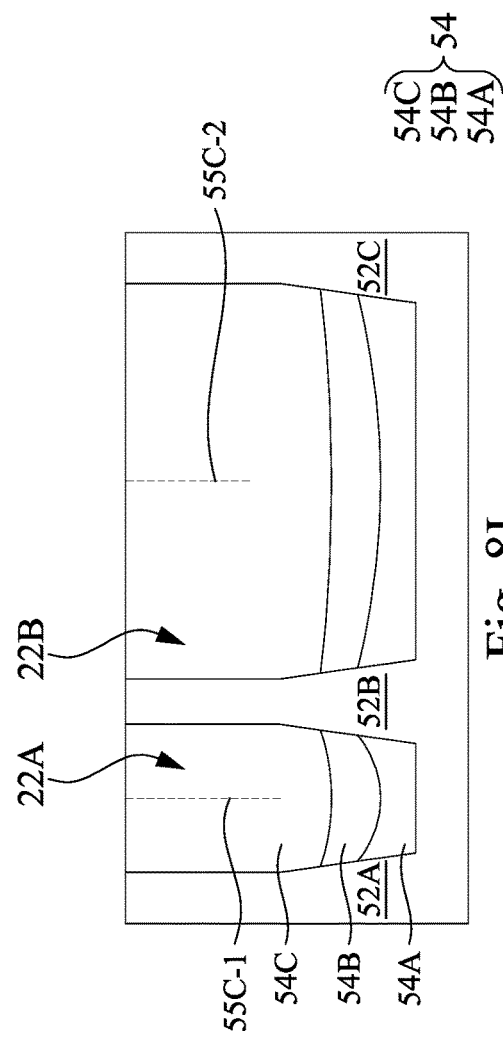

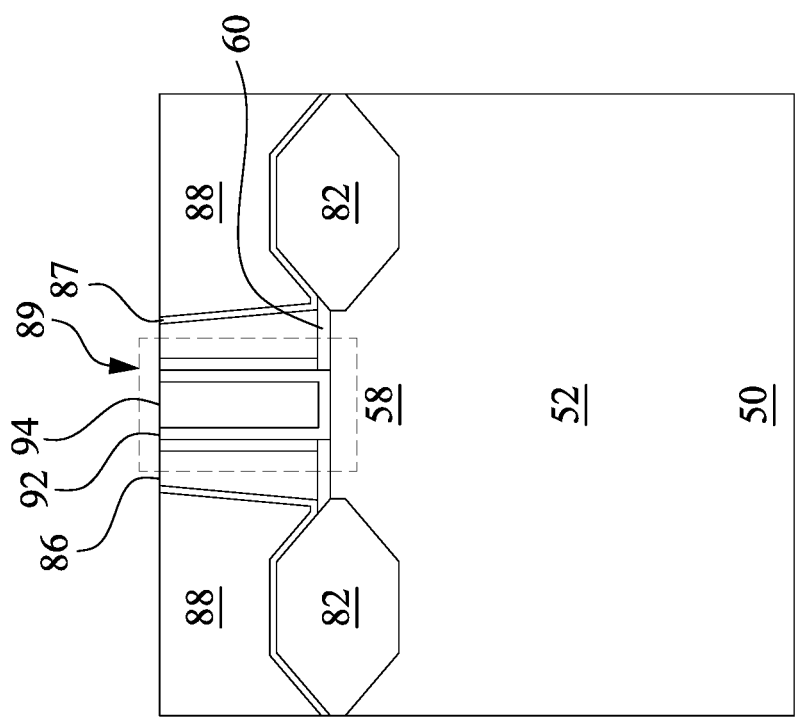
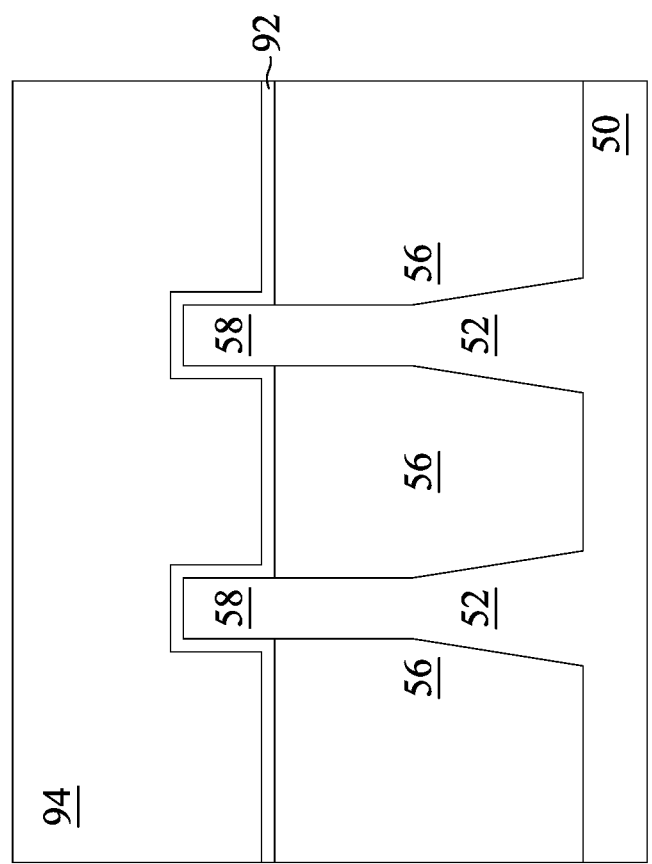
Fig. 17B
Fig. 17A

GAPFILL STRUCTURE AND MANUFACTURING METHODS THEREOF

PRIORITY CLAIM AND CROSS-REFERENCE

This application claims the benefit of U.S. Provisional Application No. 63/064,542, filed on Aug. 12, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best conunderstood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, 4B, 5A, 5B, 6, 7A, 7B, 7C, 7D, 7E, 7F, 7G, 7H, 7I, 7J, 8A, 8B, 8C, 8D, 8E, 8F, 8G, 8H, 8I, 8J, 9, 10, 11A, 11B, 12A, 12B, 13A, 13B, 13C, 13D, 14A, 14B, 15A, 15B, 16A, 16B, 17A, 17B, 17C 18A, 18B, 19A, and 19B are cross-sectional views of intermediate stages in the manufacturing of FinFETs, in accordance with some embodiments.

DETAILED DESCRIPTION

Figure 1:
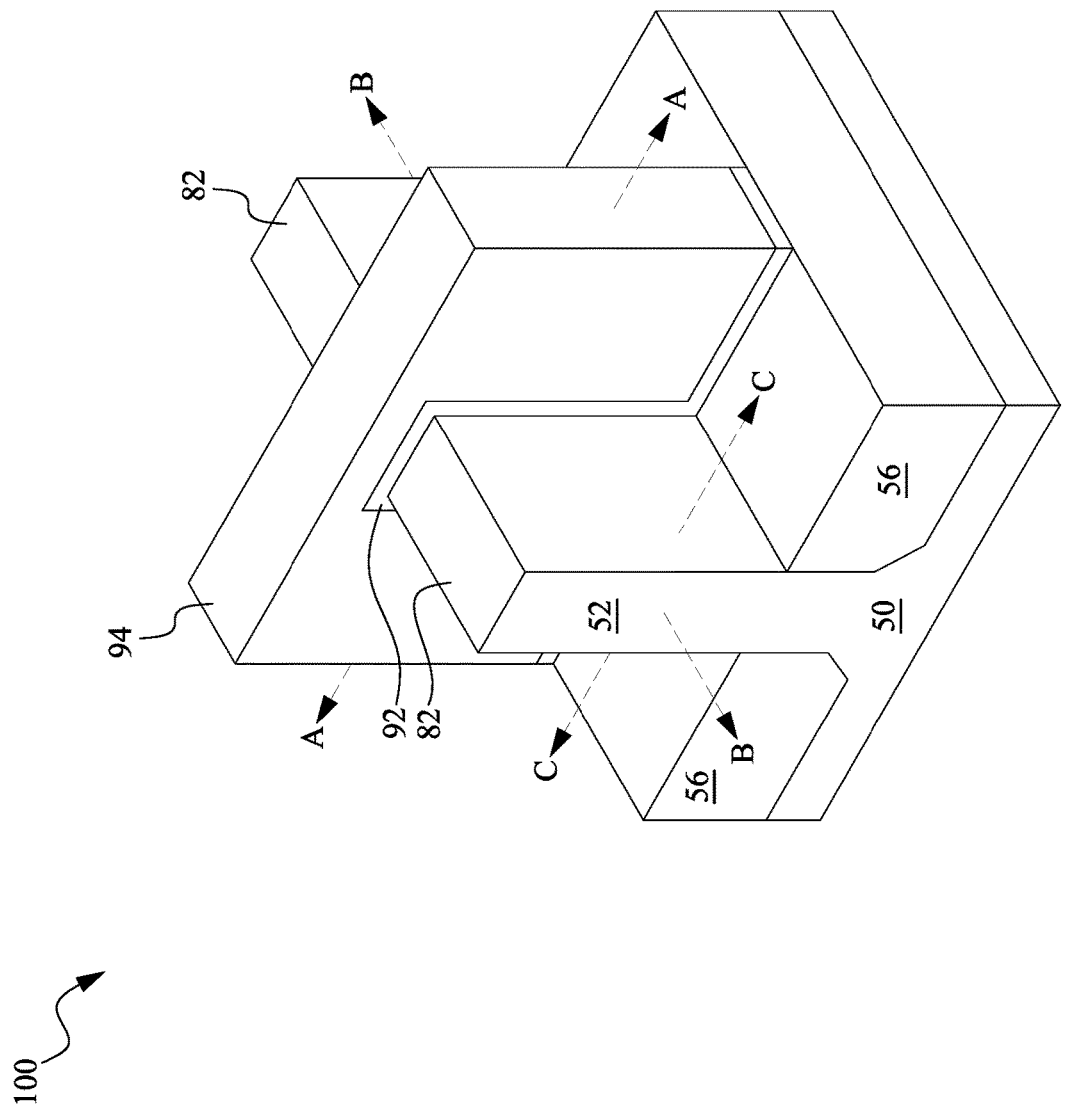
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method for filling a trench and the resulting structure. The trench may be filled with any suitable material, such as a low-k dielectric material, a metal oxide, a metal nitride, a pure metal, combinations thereof, or the like. Filling the trench may include one or more deposition and etch back depositing cycles. For example, a first material may be deposited in the trench using a conformal deposition process (e.g., chemical vapor deposition (CVD), atomic layer deposition (ALD), or the like) and the first material may be etched to a desired height. This deposition and etch-back process may be repeated until a desired configuration of materials is achieved. Due to the conformal deposition process, the first material may have a seam that is formed as regions of the first material are deposited on sidewalls of the trench and eventually merge. In some embodiments, the etch back process removes portions of the first material containing the seam. Various embodiments may provide for seam free deposition through ALD processes (e.g., thermal-based ALD, plasma-assisted ALD, or the like) without requiring a post deposition anneal, plasma bombardment, or using inhibitors, thereby reducing manufacturing defects.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 19B are cross-sectional views of intermediate stages in the manufacturing of FinFETs, in accordance with some embodiments. FIGS. 2, 3, 4A, 4B, 5A, 5B, 6, 7A, 7B, 7C, 7D, 7E, 7F, 7G, 7H, 7I, 7J, 8A, 8B, 8C, 8D, 8E, 8F, 8G, 8H, 8I, 8J, 9, and 10 illustrate reference cross-section A-A illustrated in FIG. 1, except for multiple fins/FinFETs. FIGS. 11A, 12A, 13A, 14A, 15A, 16A, 17A, 18A, and 19A are illustrated along reference cross-section A-A illustrated in FIG. 1, and FIGS. 11B, 12B, 13B, 14B, 15B, 16B, 17B, 17C, 18B, and 19B are illustrated along a similar cross-section B-B illustrated in FIG. 1, except for multiple fins/FinFETs. FIGS. 13C and 13D are illustrated along reference cross-section C-C illustrated in FIG. 1, except for multiple fins/FinFETs.

Figure 2:
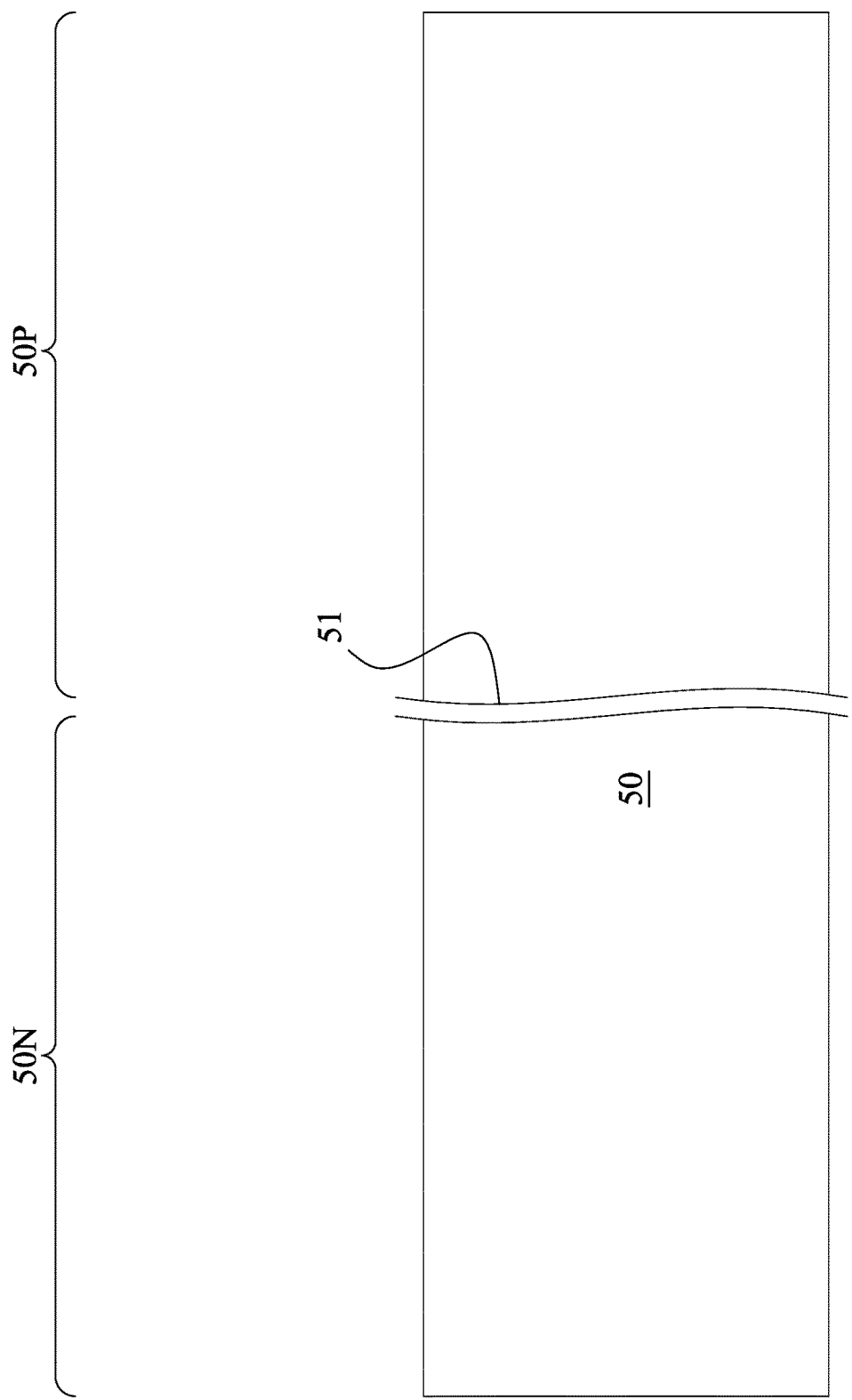

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
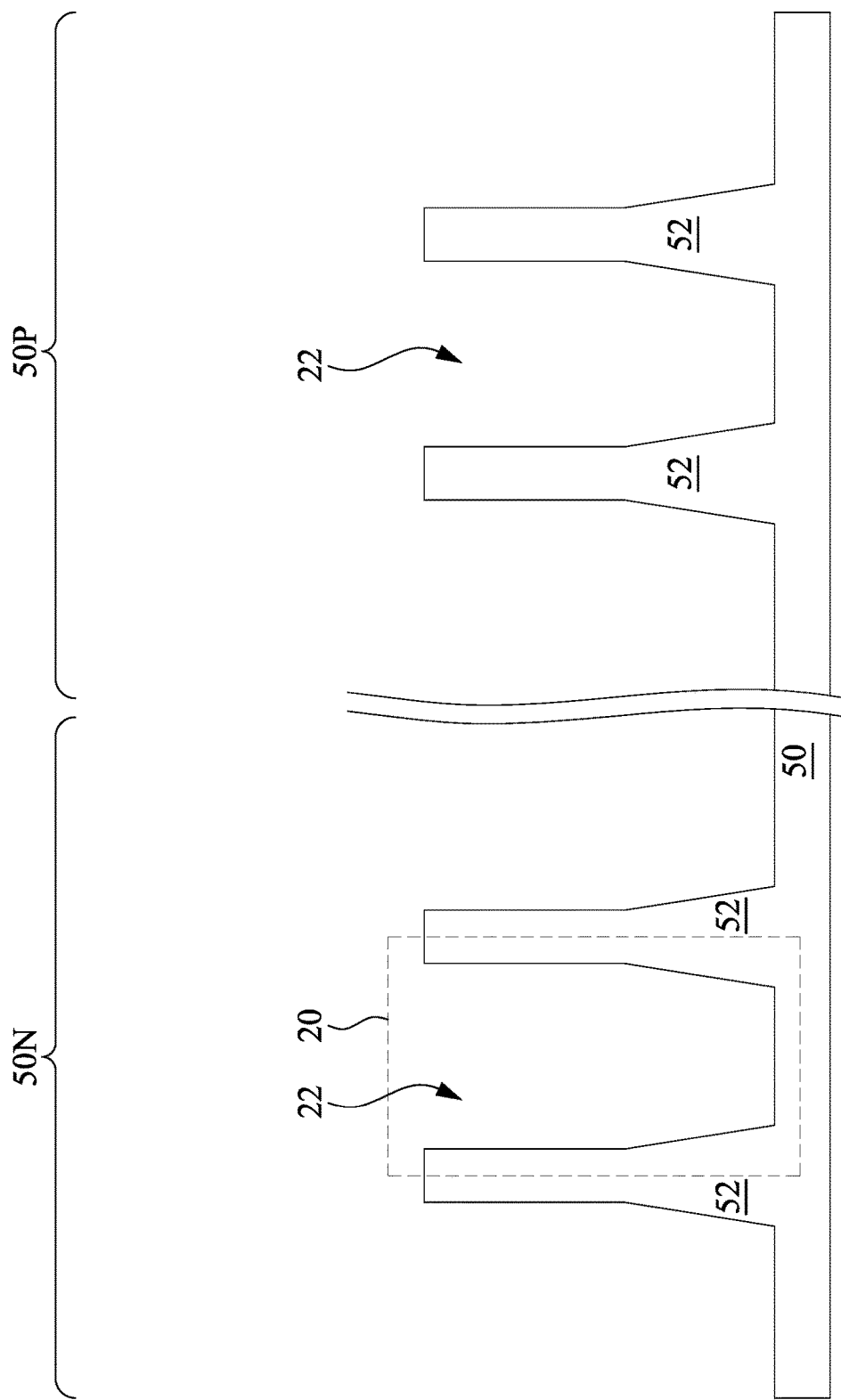

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. Forming the fins 52 may further define trenches 22 between adjacent ones of the fines 52, such as in a region 20.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4B:
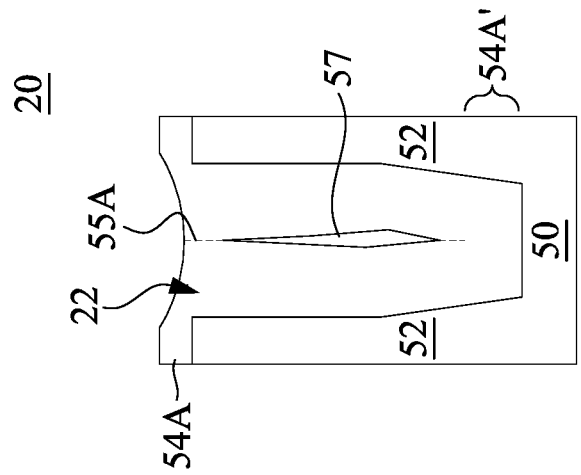
Figure 4A:
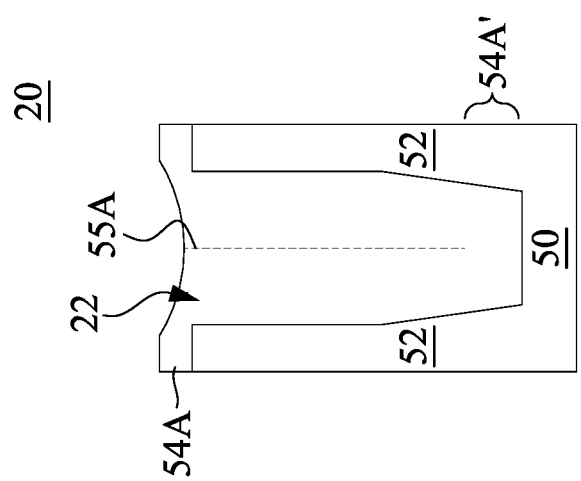

In FIGS. 4A through 7J, an insulating material 54 is formed in the trenches 22 between neighboring fins 52 and over the substrate 50. FIGS. 4A through 7G illustrate a detailed view of the region 20 between adjacent ones of the fins 52. Referring to FIG. 4A, a first insulating material 54A is deposited in the trenches 22. The first insulating material 54A may be deposited by a conformal deposition process, such as CVD, ALD, or the like. In some embodiments, the conformal deposition process may be heat-assisted (e.g., performed above room temperature) and/or plasma-assisted (e.g., performed using one or more plasma precursors) to improve the step coverage of the deposition process. In some embodiments, the first insulating material 54A may be a dielectric film, such as $Si_xO_yC_zN_w$, wherein x, y, z, and w are each numbers greater than or equal to zero. In other embodiments, the first insulating material 54A may comprise C, Si, Ge, a metal alloy (e.g., $Al_2O_3$, TiN, TiAlN, or the like), combinations thereof, or the like. The embodiments described herein are in a context of forming STI regions by depositing and etching insulating materials. However, other embodiments may apply to other gap filling processes (e.g., gate fill process, damascene processes, or the like). In such embodiments, the material deposited in the trenches may be a semiconductor or a metal, such as, Si, Ge, C.

Depositing the first insulating material 54A may include depositing the first insulating material 54A conformally on sidewalls and a bottom surface of the trenches 22. The deposition may continue until portions of the first insulating material 54A on the sidewalls of the trenches 22 merges together and a seam 55A is formed, thereby filling the trenches 22. In some embodiments, as illustrated by FIG. 4B, a void 57 may also be formed along the seam 55A due to manufacturing variances of the deposition process. It has been observed that the first insulating material 54A may be more susceptible to etching along the seam 55A and the void 57. Further, a bottom region 54A' of the first insulating material 54A may be free of the seam 55A. For example, the seam 55A does not extend into the bottom region 54A' of the first insulating material 54A.

Figure 5B:
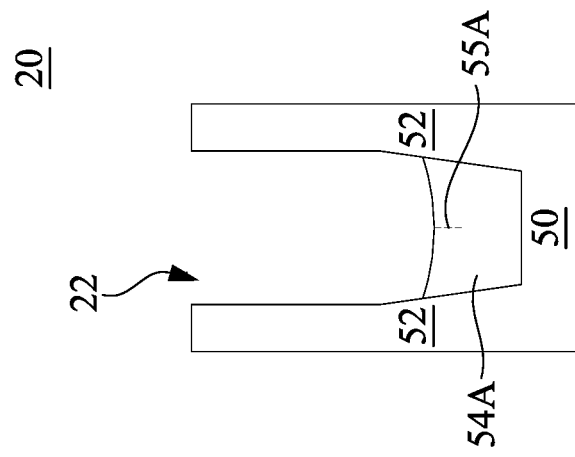
Figure 5A:
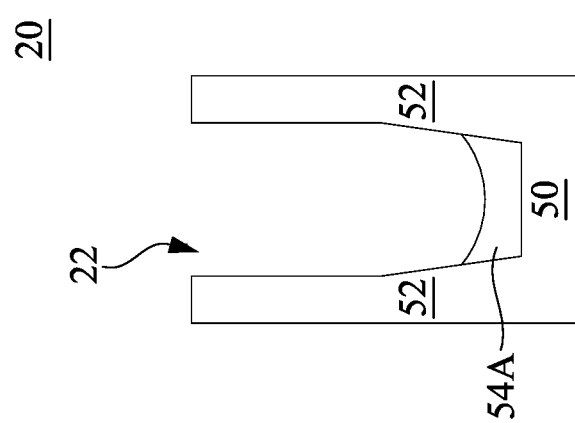

Next, in FIG. 5A, an etch back process may be performed to recess the first insulating material 54A below tops of the fins 52. The etch back process may include a wet etch process, a dry etch process, or the like. For example, in embodiments where the insulating material 54A comprises SiOCN, $CHF_3$ and $O_2$; $CF_4$ and $O_2$; and $NF_3$, $CH_3F$, and/or $CHF_3$ may be used as etchants in a dry etch process. As another example in embodiments where the insulating material 54A comprises SiOCN, HF may be used as an etchant in a wet etch process. The etch back process may be anisotropic. In some embodiments, as illustrated by FIG. 5A, the etch back process recesses the first insulating material 54A such that the seam 55A and any voids 57 (see FIGS. 4A and 4B) are removed. For example, the etch back process may etch into the bottom region 54A' of the first insulating material 54A. In other embodiments, as illustrated in FIG. 5B, the etch back process may leave a portion of the seams 55A and/or any voids (not explicitly illustrated). The amount of the first insulating material 54A that is removed may be controlled, for example, by controlling a duration of the etch back process. As a result of the etch back process, a top surface of the first insulating material 54A may be concave.

Subsequently, in FIG. 6, a second insulating material 54B may be deposited in the trenches 22 over the first insulating material 54A. The second insulating material 54B may be deposited by a conformal deposition process, such as CVD, ALD, or the like. In some embodiments, the conformal deposition process may be heat-assisted (e.g., performed above room temperature) or plasma-assisted (e.g., performed using one or more plasma precursors) to improve the step coverage of the deposition process. In some embodiments, the second insulating material 54B may be a dielectric film, such as $Si_xO_yC_zN_w$, wherein x, y, z, and w are all numbers greater than or equal to zero. In other embodiments, the second insulating material 54B may comprise C, Si, Ge, a metal alloy (e.g., $Al_2O_3$, TiN, TiAlN, $ZrO_2$ or the like), combinations thereof, or the like.

In some embodiments, the second insulating material 54B may have a different material composition as the first insulating material 54A, and a bottom surface of the second insulating material 54B may form an interface with a top surface of the first insulating material 54A. In some embodiments, the interface between the second insulating material 54B and the first insulating material 54A may be concave. For example, the first insulating material 54A may be a low-k material (e.g., having a k-value lower than or equal to silicon dioxide, such as SiCN, SiOCN, or the like), and the second insulating material 54B may be a metal oxide or a metal nitride (e.g., $ZrO_2$, TiN, or the like) that is less susceptible to etching than the first insulating material 54A. In such embodiments, the first insulating material 54A may be slightly porous for a lower k-value. Thus, the first insulating material 54A may be included for its low k-value to reduce parasitic capacitance, and the second insulating material 54B may be included to protect the first insulating material 54A during subsequent processing steps (e.g., subsequent etching steps). In other embodiments, the second insulating material 54B may have a same material composition as the first insulating material 54A.

Depositing the second insulating material 54B may include depositing the second insulating material 54B conformally on sidewalls and a bottom surface of the trenches 22 over the first insulating material 54A. The deposition may continue until portions of the second insulating material 54B on the sidewalls of the trenches 22 merges together and a seam 55B is formed, thereby filling the trenches 22. In some embodiments, a void may form along the seam 55B due to manufacturing variances of the deposition process. Further, a bottom region 54B' of the second insulating material 54B may be free of the seam 55B. For example, the seam 55B does not extend into the bottom region 54B' of the second insulating material 54B.

The steps illustrated above in FIGS. 4A, 5A, and 6 may be repeated any number of times until a desired configuration of insulating materials is deposited to fill the trenches 22. For example, FIGS. 7A through 7G illustrate alternative configurations of the insulating material 54 (e.g., comprising the insulating materials 54A, 54B, 54C, 54D, 54E, and/or 54F) after one or more deposition etch cycles according to some embodiments. In each of the FIGS. 7A through 7G, a planarization stop line 59 indicates a level at which a subsequent planarization step (e.g., a CMP) may end at. Accordingly, any material above the planarization stop line 59 may be removed in the planarization step (see e.g., FIGS. 8A through 8J) while materials below the planarization stop line 59 remains after the planarization step.

Figure 7C:
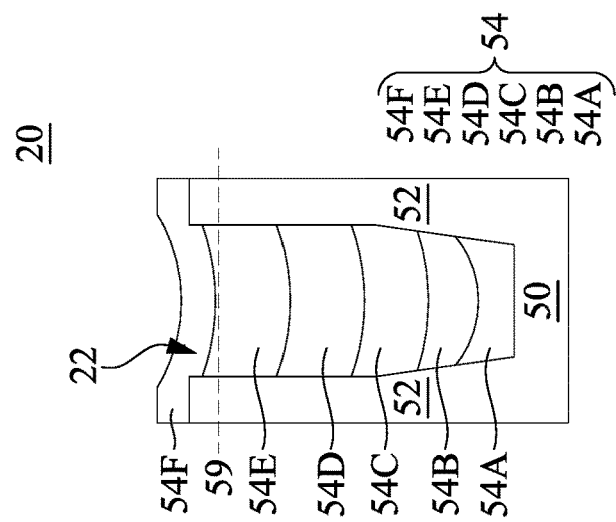
Figure 7B:
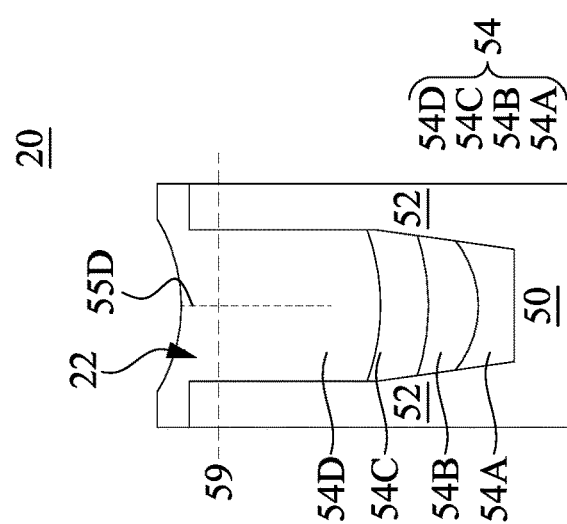
Figure 7A:
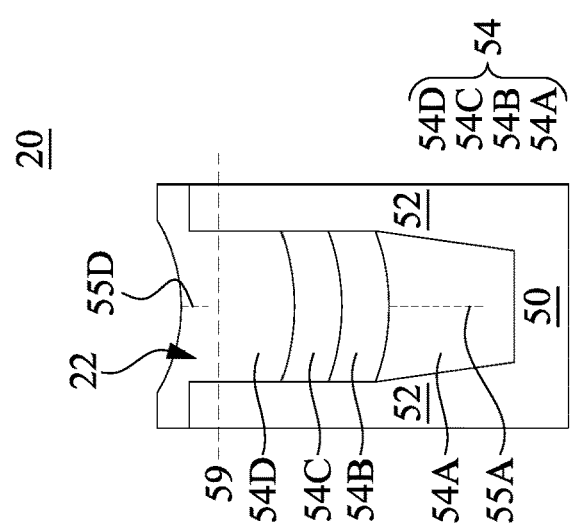

FIG. 7A illustrates an embodiment where the second insulating material 54B is recessed, a third insulating material 54C is deposited over the second insulating material 54B, the third insulating material 54C is recessed (e.g., below a seam of the third insulating material 54C), and a fourth insulating material 54D is deposited over the third insulating material 54C. Recessing the first insulating material 54A may leave a portion of the seam 55A while removing seams from the second insulating material 54B and a third insulating material 54C. A seam 55D of the fourth insulating material 54D may end above the planarization stop line 59.

A material composition of the fourth insulating material 54D and/or the third insulating material 54C may be the same or different from a material composition of the second insulating material 54B and/or the first insulating material 54A. For example, the first insulating material 54A may be a material with a relatively low k value, such as silicon dioxide, SiCN, SiOCN, or the like; the second insulating material 54B and the third insulating material 54C may each be a metal oxide or metal nitride, such as $ZrO_2$, TiN, or the like; and the fourth insulating material 54D may be a dielectric film, such as silicon dioxide, $SiN_2$, or the like. In such embodiments, the second insulating material 54B and third insulating material 54C may protect the underlying first insulating material 54A from defects resulting from etching. Further, when the second insulating material 54B has a same material composition as the third insulating material 54C have a same material composition, no interface may be formed between the second insulating material 54B and the third insulating material 54C. When the second insulating material 54B has a different material composition than the third insulating material 54C, an interface may be formed between the second insulating material 54B and the third insulating material 54C. In other embodiments, each of the first, second, third, and fourth insulating materials 54A, 54B, 54C, and 54D may have a same material composition (e.g., a low-k dielectric film). In some embodiments, a thickness of the second insulating material 54B may be in a range of about 3 nm to about 6 nm, and a combined thickness of the second and the third insulating materials 54B and 54C may be in a range of about 7 nm to about 13 nm.

FIG. 7B illustrates an alternative embodiment where the first insulating material 54A is recessed to remove the seam 55A, and a seam of the fourth insulating material 54D extends below the planarization stop line 59. Materials of the first, second, third, and fourth insulating materials 54A, 54B, 54C, and 54D may be similar to those described above with respect to FIG. 7A.

FIG. 7C illustrates an alternative embodiment where each of the insulating materials 54A, 54B, 54C, 54D, 54E, and 54F are recessed or deposited to not form a seam or to remove a seam. Accordingly, a seamless insulating material 54 may be formed in FIG. 7C by a deposition-etching process described above without a post-deposition anneal, high plasma bombardment processes, or inhibitors, and the risk of damage due to any of these processes is avoided. Materials of the first, second, third, and fourth insulating materials 54A, 54B, 54C, and 54D may be similar to those described above with respect to FIG. 7A. Further, each of the fifth insulating material 54E and the sixth insulating material 54F may be formed of a similar process and a similar material as that described above with respect to the second insulating material 54B.

Figure 6:
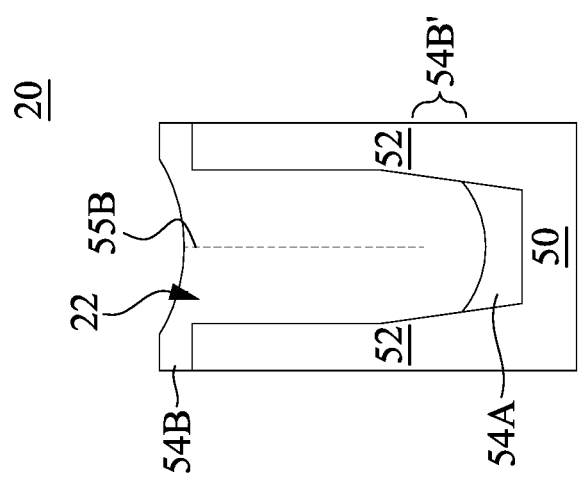
Figure 7D:
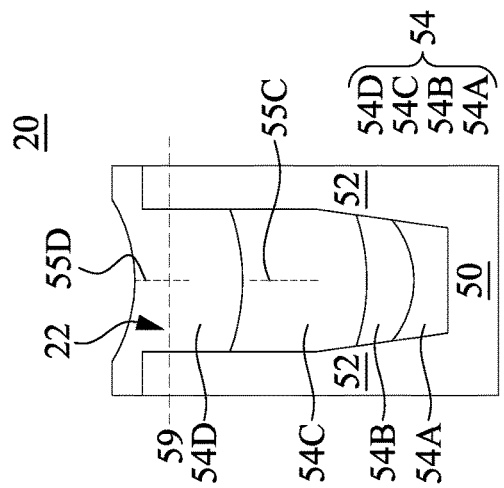
Figure 7E:
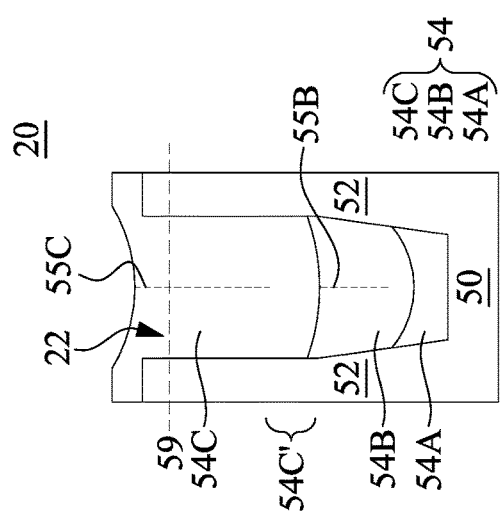

FIG. 7D illustrates an embodiment where deposition-etch processing ends at the stage described with respect to FIG. 6. FIG. 7E illustrates an embodiment where three insulating materials 54A, 54B, and 54C are deposited in the trenches 22. The seam 55A is removed from the first insulating material 54A. The seam 55B remains in the second insulating material 54B, and a seam 55C is formed in the third insulating material 54C. The seam 55C may extend below the planarization stop line 59. A seam free region 54C' may be disposed between the seam 55C of the third insulation material 54C and the seam 55B of the second insulation material 54B. Materials of the first, second, and third insulating materials 54A, 54B, and 54C may be similar to those described above with respect to FIG. 7A.

Figure 7F:
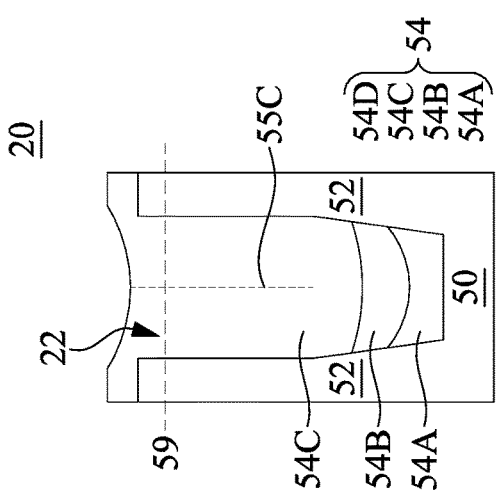

FIG. 7F illustrates an embodiment where four insulating materials 54A, 54B, 54C, and 54D are deposited in the trenches 22. The seams 55A and 55B are removed from the first and second insulating materials 54A and 54B. The seams 55C and 55D remain in the third insulating material 54C and the fourth insulating material 54D, respectively. The seam 55D may extend below the planarization stop line 59. Materials of the first, second, third, and fourth insulating materials 54A, 54B, 54C, and 54D may be similar to those described above with respect to FIG. 7A.

Figure 7G:
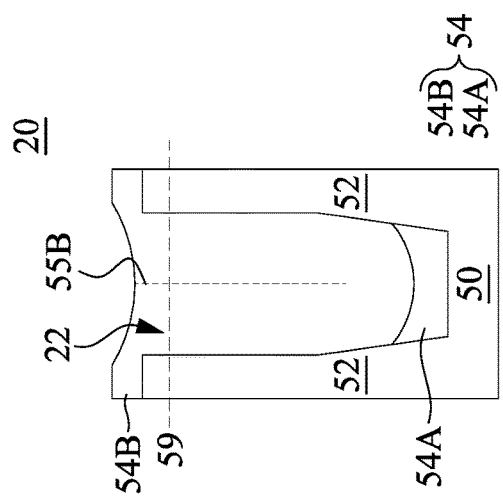

FIG. 7G illustrates an embodiment where three insulating materials 54A, 54B, and 54C are deposited in the trenches 22. The seams 55A and 55B are removed from the first and second insulating materials 54A and 54B and a seam 55C is formed in the third insulating material 54C. The seam 55C may extend below the planarization stop line 59. Materials of the first, second, and third insulating materials 54A, 54B, and 54C may be similar to those described above with respect to FIG. 7A.

Figure 7J:
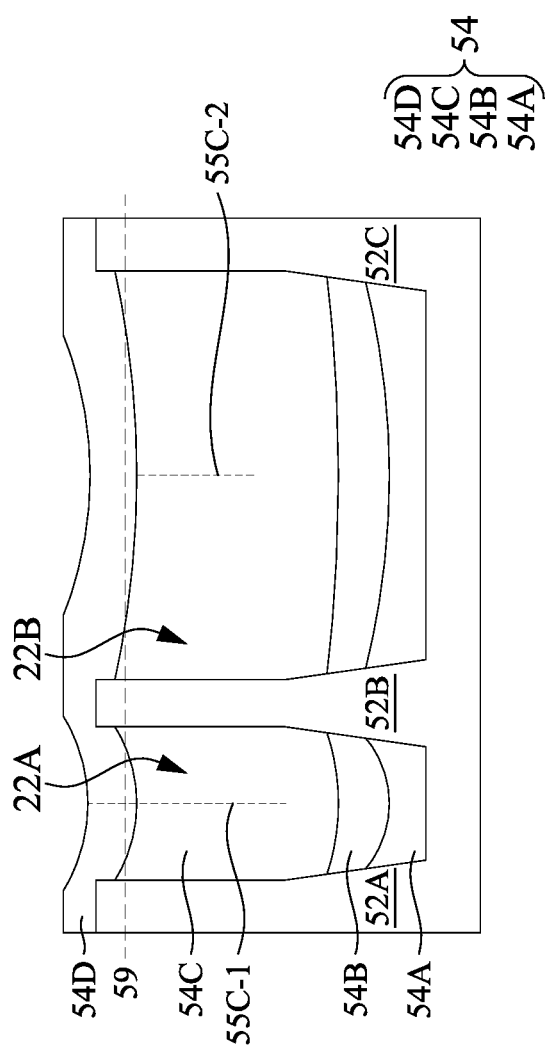

In FIGS. 3 and 7A through 7G, only two fins 52 are illustrated. FIGS. 7H through 7J illustrate fins 52A, 52B, and 52C, which are spaced different distances apart. For example, the fins 52A and 52B are spaced closer together than the fins 52B and 52C. A first trench 22A is disposed between the fins 52A and 52B, and a second trench 22B is disposed between the fins 52B and 52C. The first trench 22A may be narrower than the second trench 22B, and as illustrated, seams in the trench 22A extend deeper than seams in the trench 22B.

For example, FIG. 7H illustrates an embodiment where a first insulating material 54A and a second insulating material 54B are deposited in the trenches 22A and 22B. Materials of the first and second insulating materials 54A and 54B may be similar to those described above with respect to FIG. 7A, and the first material 54A and the second material 54B may be formed using similar processes as those described above. For example, the first insulating material 54A may be deposited in the trenches 22A and 22B, the first insulating material is then recessed in the trenches 22A and 22B, and a the second insulating material 54B is deposited over the first insulating material 54A. Recessing the first insulating material 54A may or may not include removing any seams and/or voids that are formed in the first insulating material 54A.

The second insulating material 54B includes a first seam 55B-1 in the trench 22A and a second seam 55B-2 in the trench 22B. The first seam 55B-1 may extend deeper than the second seam 55B-2 due to the conformal deposition process used to form the second insulating material 54B. For example, the second insulating material 54B is deposited conformally and may merge at a higher point in the relatively wide trench 22B than the relatively narrow trench 22A. As a result, the first seam 55B-1 extends lower than the second seam 55B-2. FIGS. 7I and 7J illustrate alternative embodiments having three insulating materials 54A, 54B, and 54C. The third insulating material 54C includes a first seam 55C-1 in the trench 22A and a second seam 55C-2 in the trench 22B. The first seam 55C-1 in the relatively narrow trench 22A extends lower than the second seam 55C-2 in the relatively wide trench 22B. Materials of the first, second, and third insulating materials 54A, 54B, and 54C may be similar to and formed using similar processes as those described above with respect to FIG. 7A. FIG. 7I illustrates an embodiment where the third insulating material 54C is a topmost layer that is deposited in the trench 22, and FIG. 7J illustrates an embodiment where a fourth insulating material 54D is deposited over the third insulating material 54C. Materials of the fourth insulating material 54D may be similar to those described above with respect to FIG. 7A.

Figure 8C:
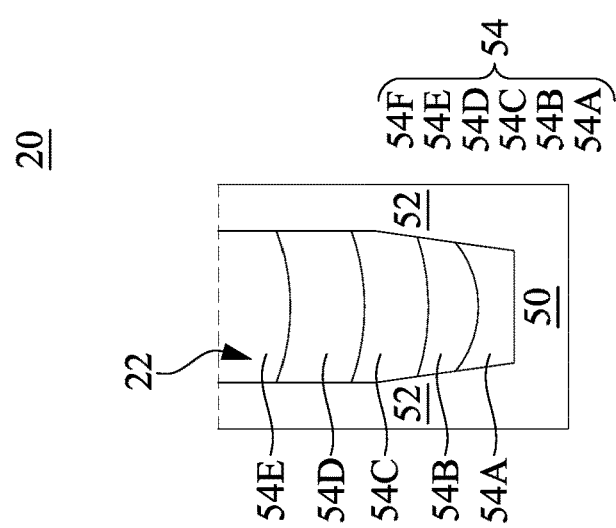
Figure 8B:
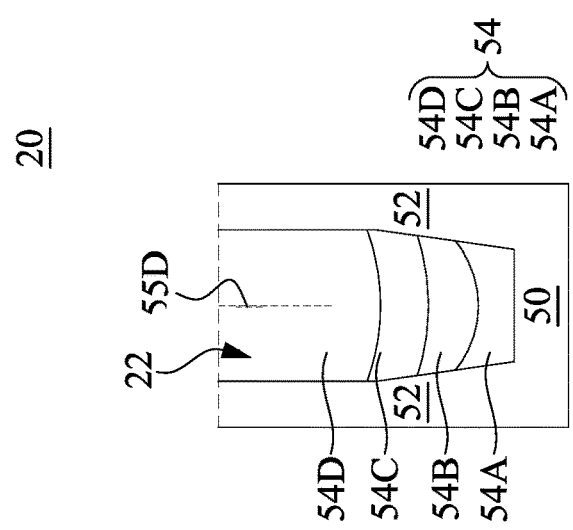
Figure 8A:
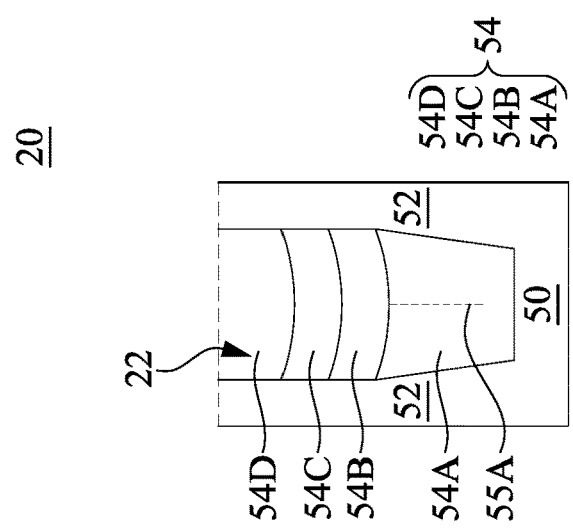
Figure 8D:
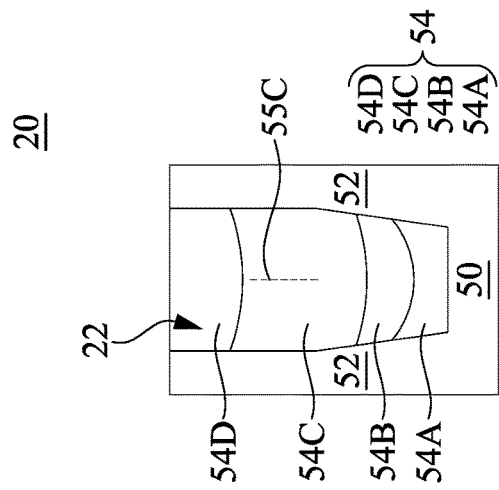
Figure 8E:
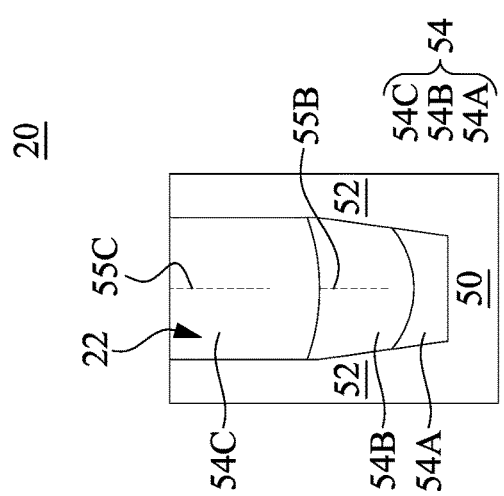
Figure 8G:
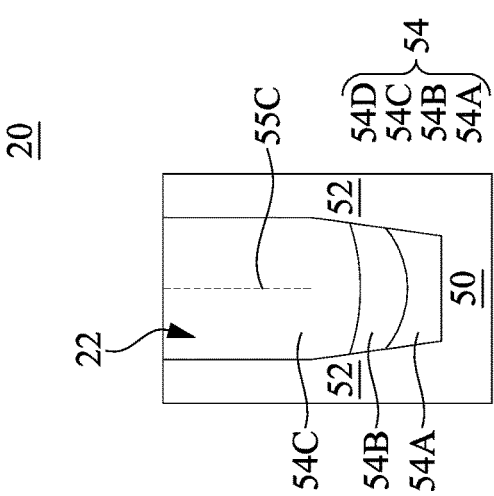
Figure 8F:
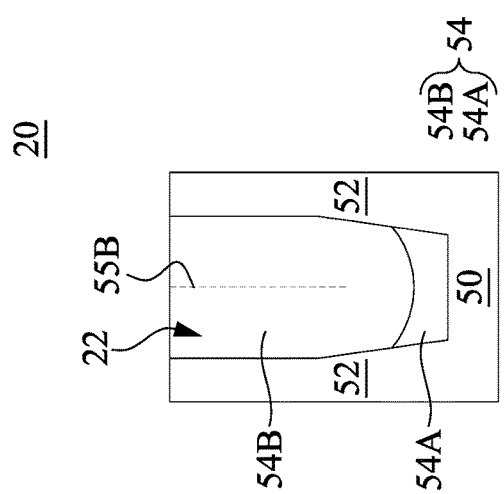
Figure 8J:
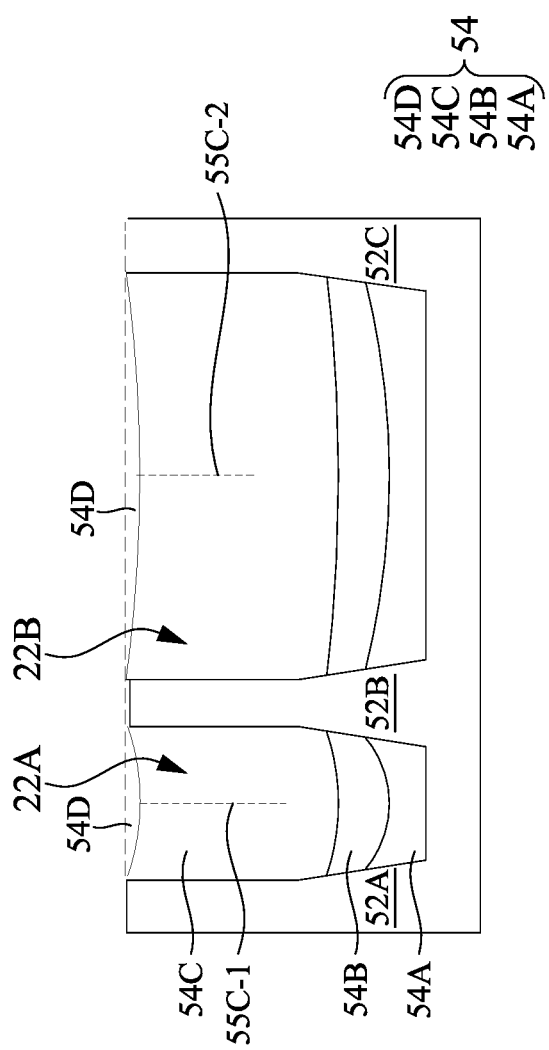

In FIGS. 8A through 8J, a removal process is applied to the insulating material 54 to remove excess insulating material 54 (e.g., comprising the first insulating material 54A, the second insulating material 54B, the third insulating material 54C, the fourth insulating material 54D, the fifth insulating material 54E, and/or the sixth insulating material 54F) over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulating material 54 are level after the planarization process is complete. In some embodiments, the planarization process may end at a level of the planarization stop line 59 of FIGS. 7A through 7J. In embodiments in which a mask remains on the fins 52, the planarization process may expose the mask or remove the mask such that top surfaces of the mask or the fins 52, respectively, and the insulating material 54 are level after the planarization process is complete. FIG. 8A corresponds to the embodiment of FIG. 7A; FIG. 8B corresponds to the embodiment of FIG. 7B; FIG. 8C corresponds to the embodiment of FIG. 7C; FIG. 8D corresponds to the embodiment of FIG. 7D; FIG. 8E corresponds to the embodiment of FIG. 7E; FIG. 8F corresponds to the embodiment of FIG. 7F; FIG. 8G corresponds to the embodiment of FIG. 7G; FIG. 8H corresponds to the embodiment of FIG. 7H; FIG. 8I corresponds to the embodiment of FIG. 7I; and FIG. 8J corresponds to the embodiment of FIG. 7J.

Figure 9:
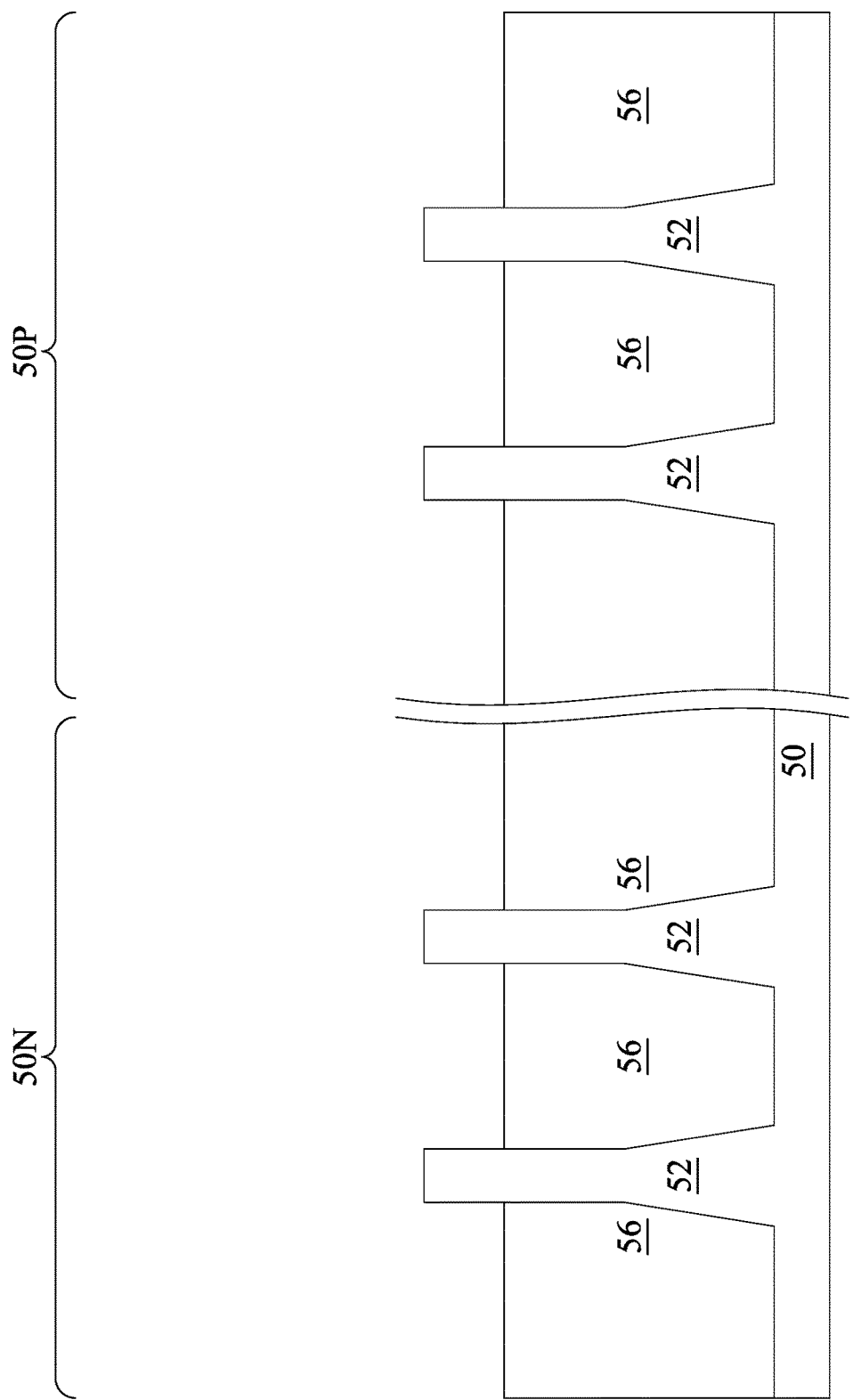

In FIG. 9, the insulating material 54 is recessed to form Shallow Trench Isolation (STI) regions 56. The insulating material 54 may have any of the configurations described above. The insulating material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulating material 54 (e.g., etches the material of the insulating material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5A-B can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 9, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 10:
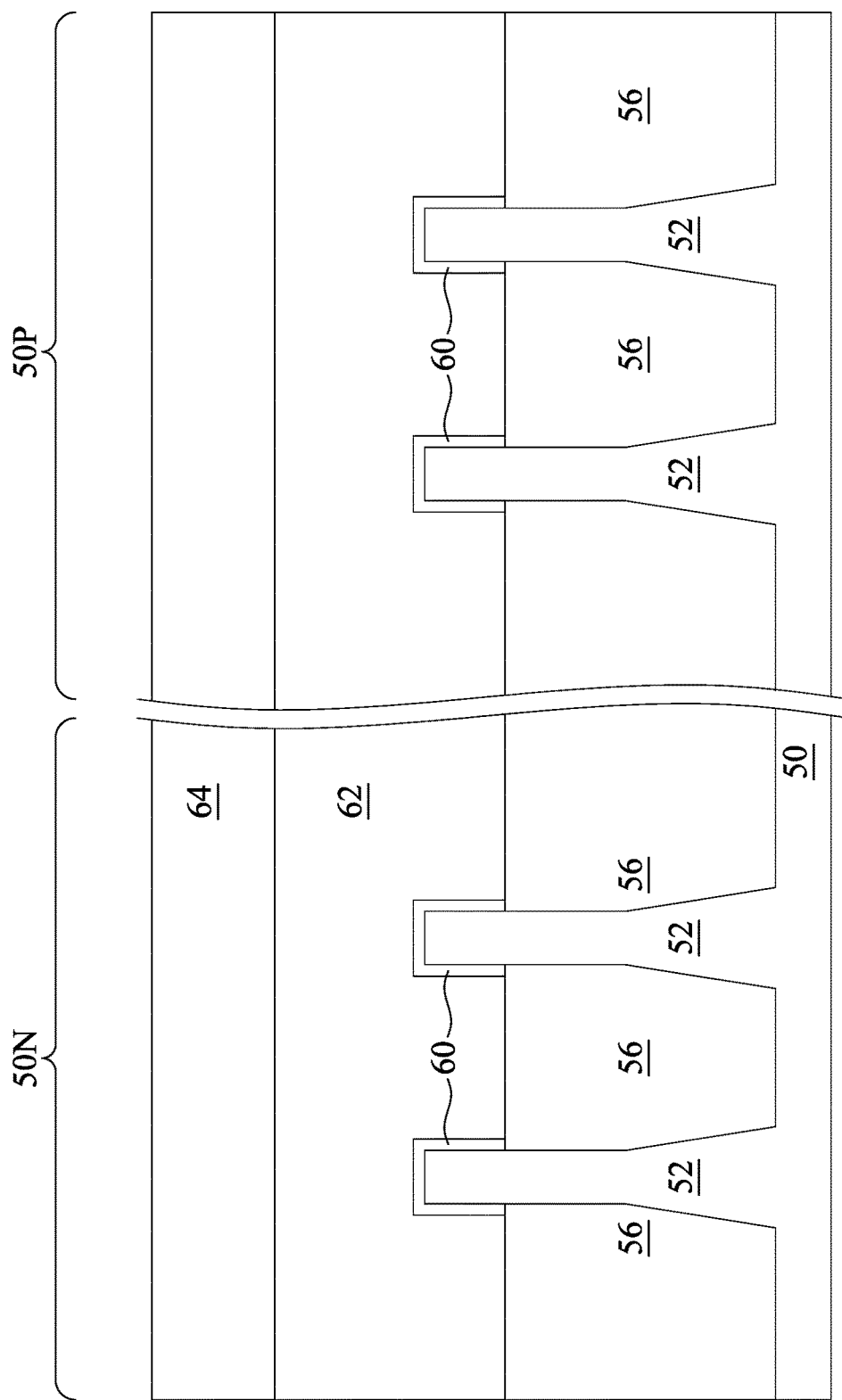

In FIG. 10, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 11A through 19B illustrate various additional steps in the manufacturing of embodiment devices. FIGS. 11A through 19B illustrate features in either of the n-type region 50N and the p-type region 50P. For example, the structures illustrated FIGS. 11A through 19B may be applicable to both the n-type region 50N and the p-type region 50P. Differences (if any) in the structures of the n-type region 50N and the p-type region 50P are described in the text accompanying each figure.

Figure 11B:
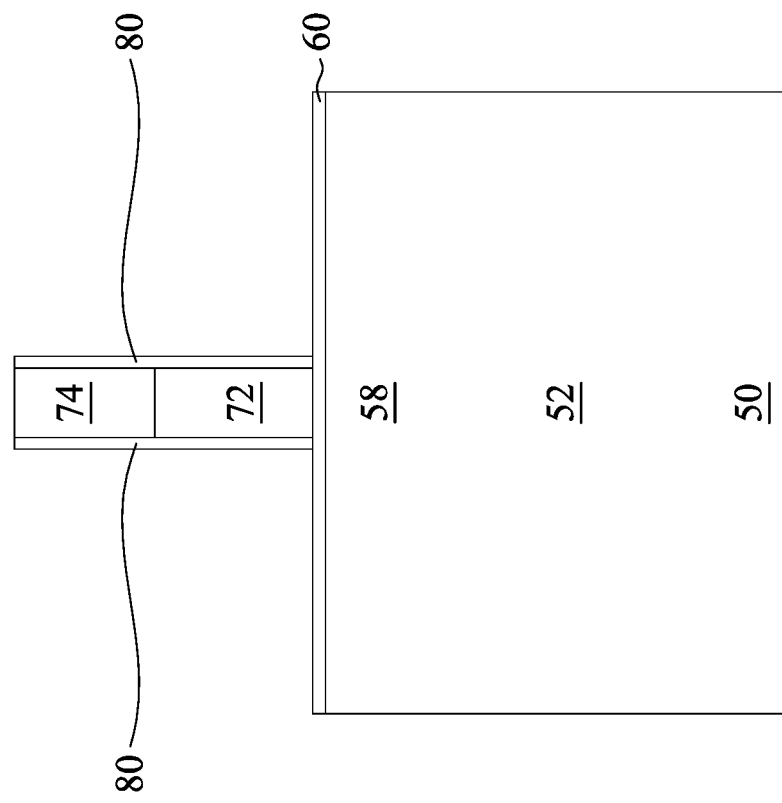
Figure 11A:
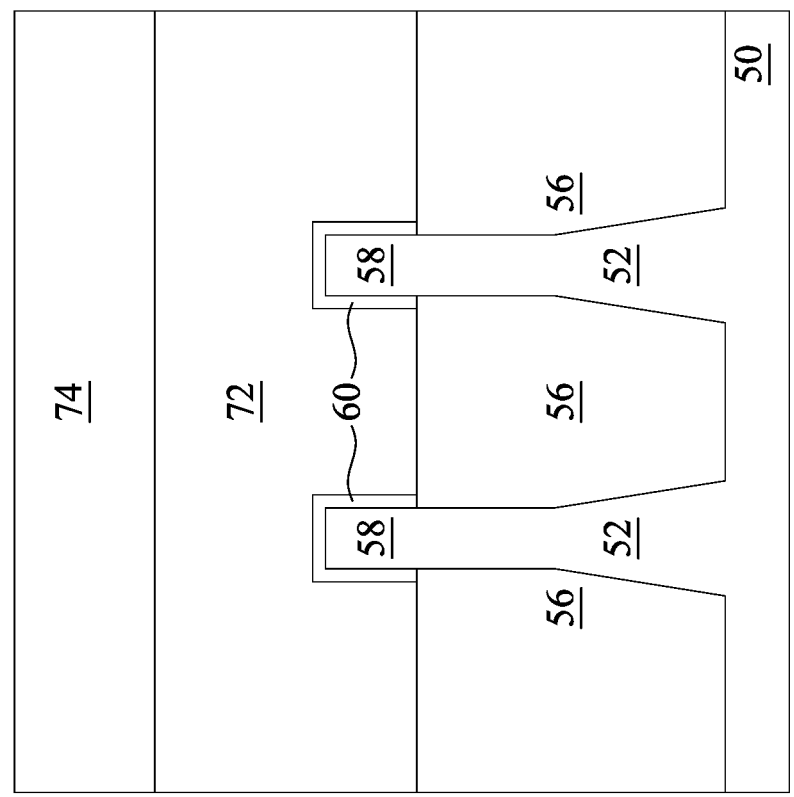

In FIGS. 11A and 11B, the mask layer 64 (see FIG. 10) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 11A and 11B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 9, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 12B:
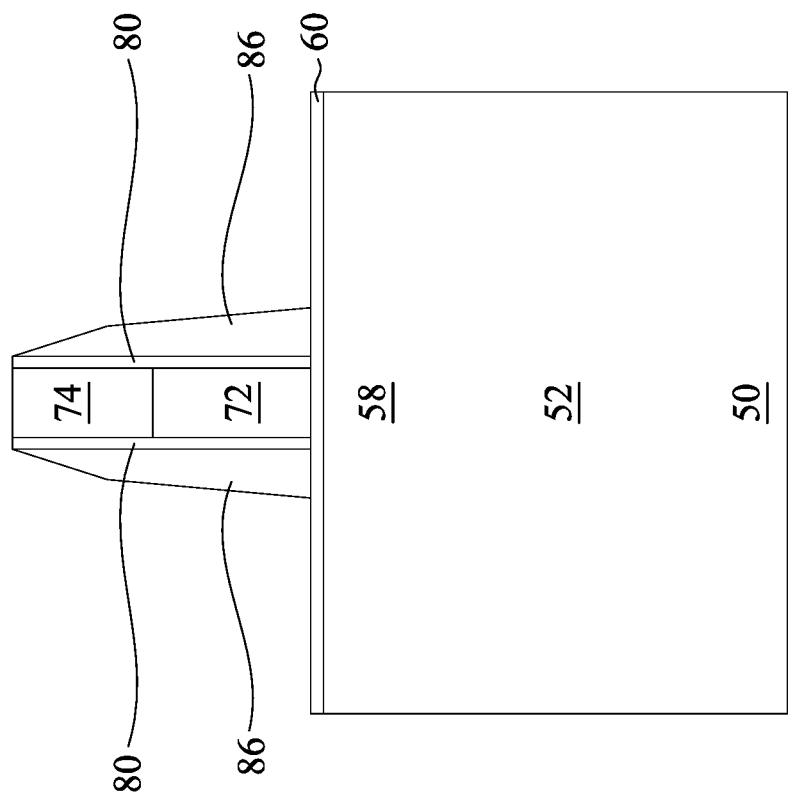
Figure 12A:
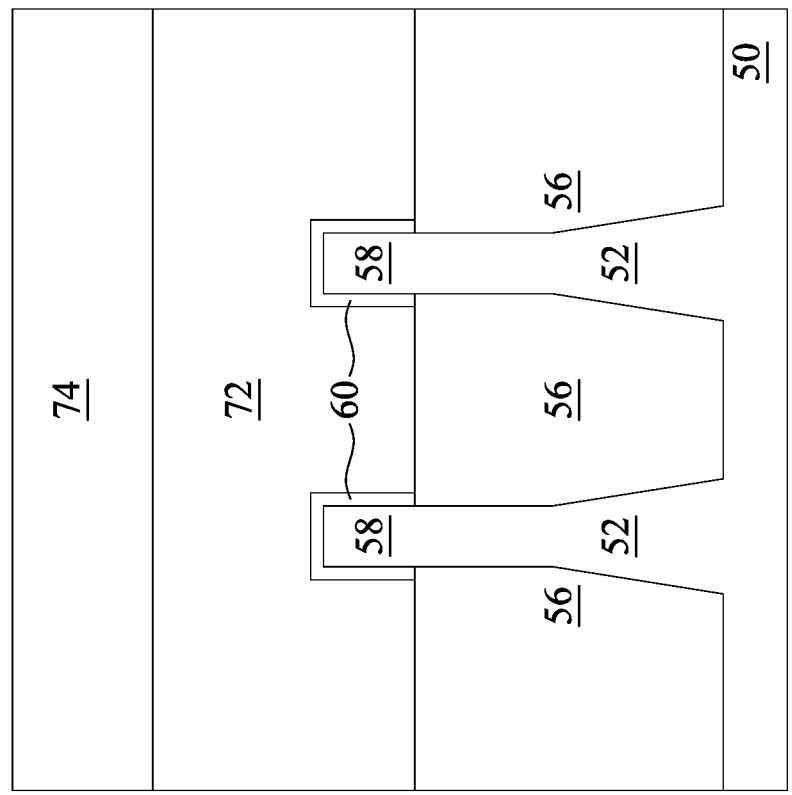

In FIGS. 12A and 12B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 13B:
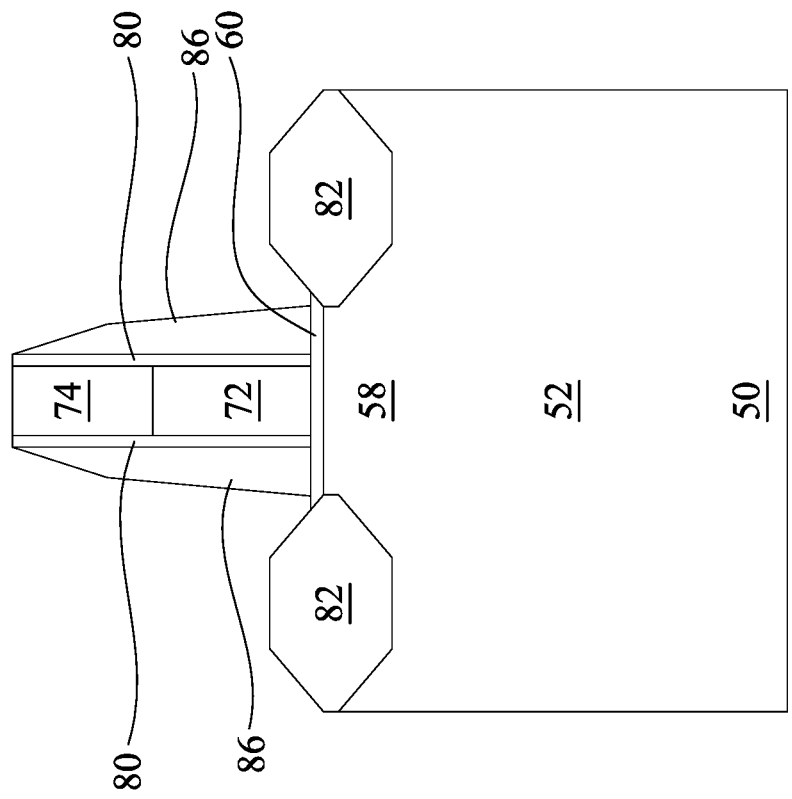
Figure 13A:
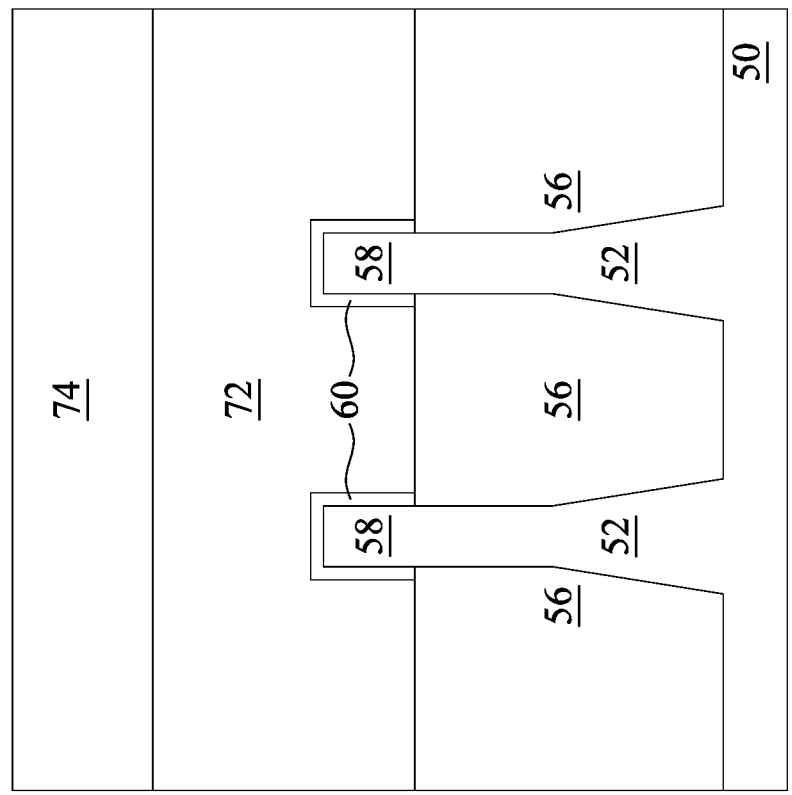
Figure 13D:
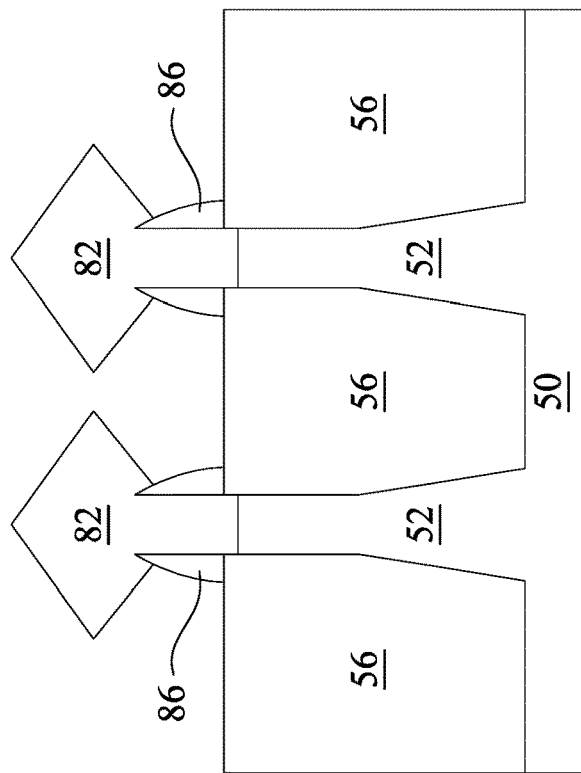
Figure 13C:
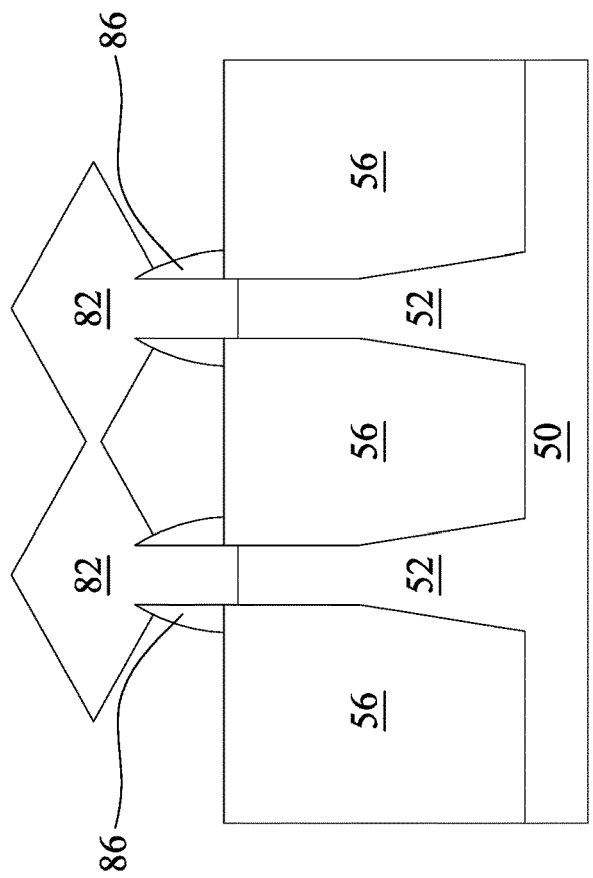

In FIGS. 13A and 13B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 13C. In other embodiments, adjacent source/drain regions 82 remain separated after the epitaxy process is completed as illustrated by FIG. 13D. In the embodiments illustrated in FIG. 10, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56

Figure 14B:
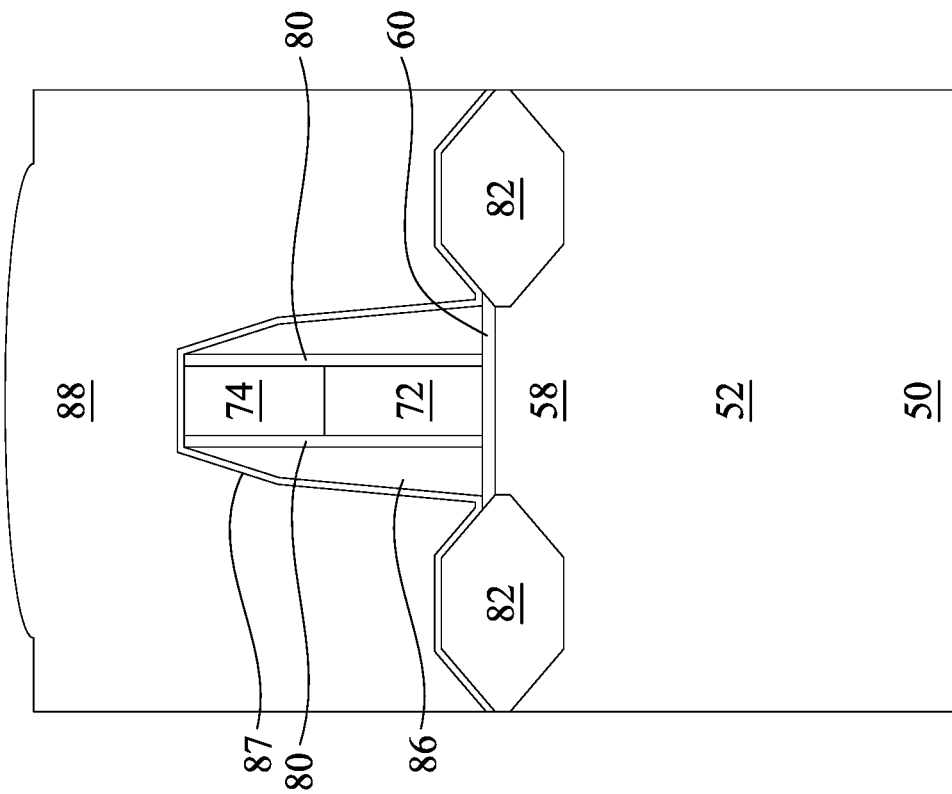
Figure 14A:
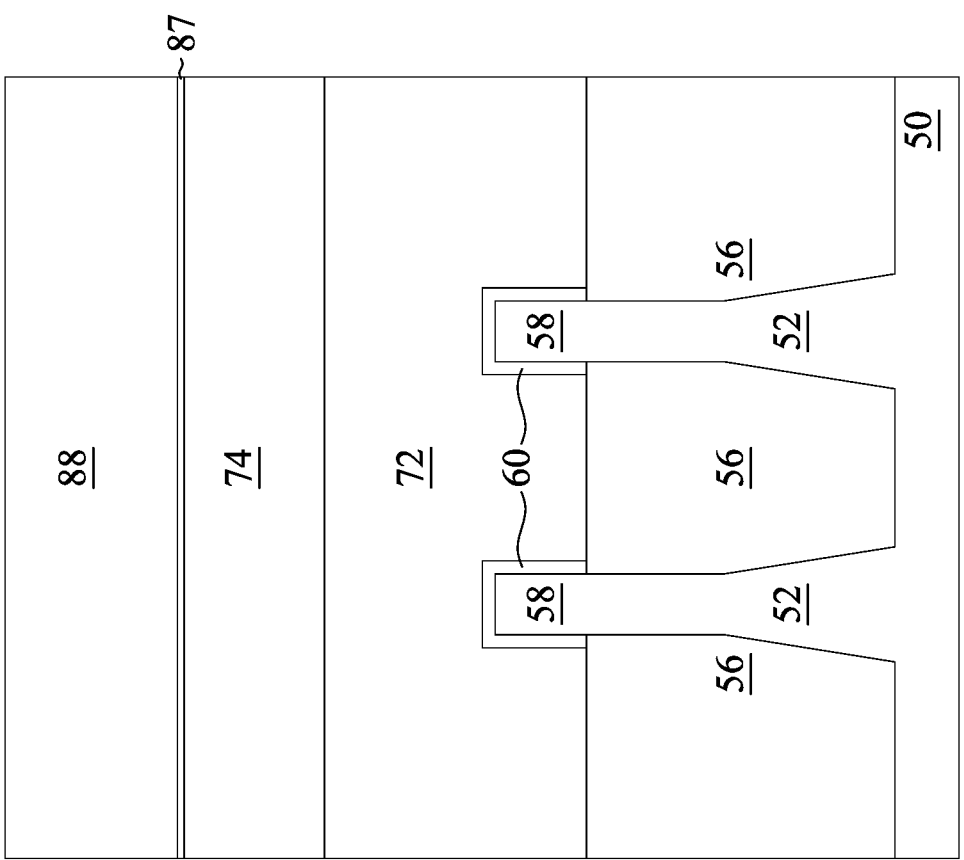

In FIGS. 14A and 14B, a first interlayer dielectric (ILD) 88 is deposited over the structure illustrated in FIG. 10. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulating materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 15B:
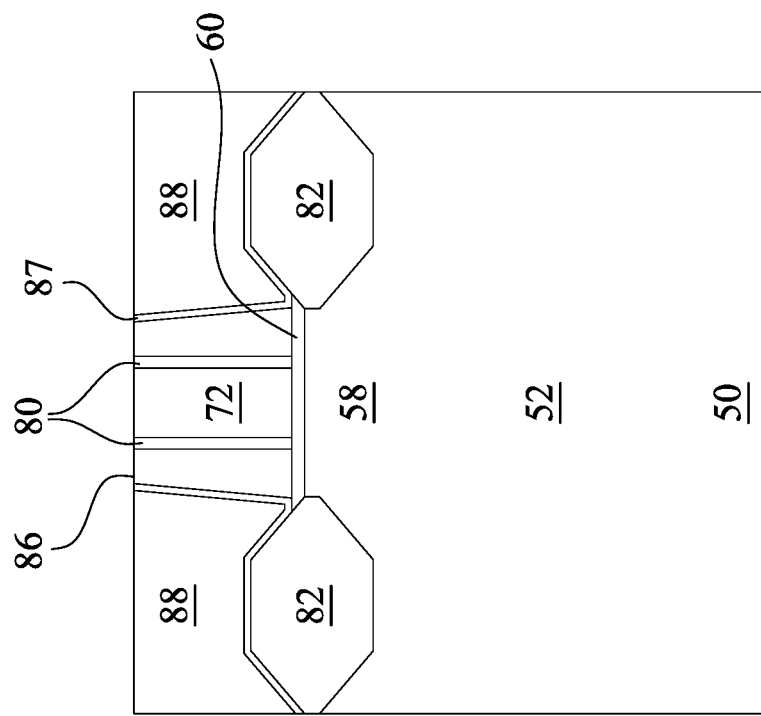
Figure 15A:
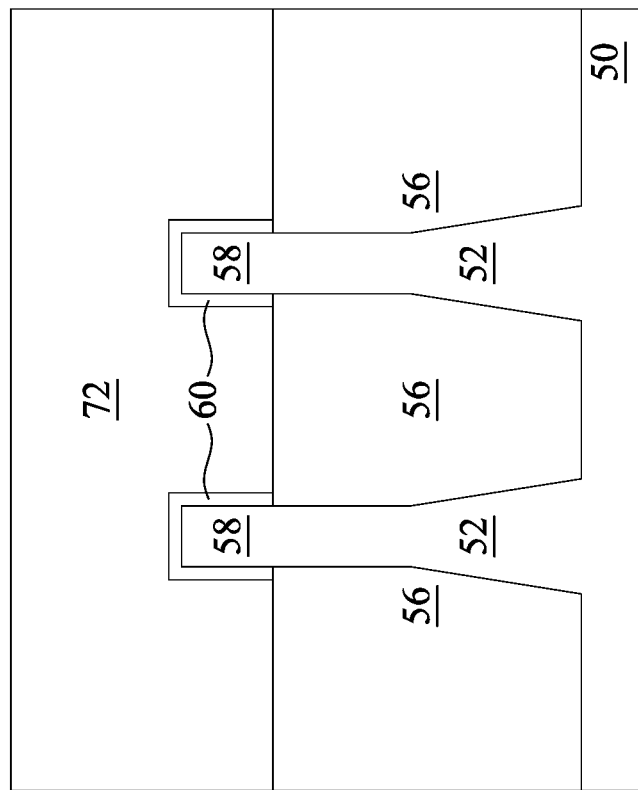

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 16B:
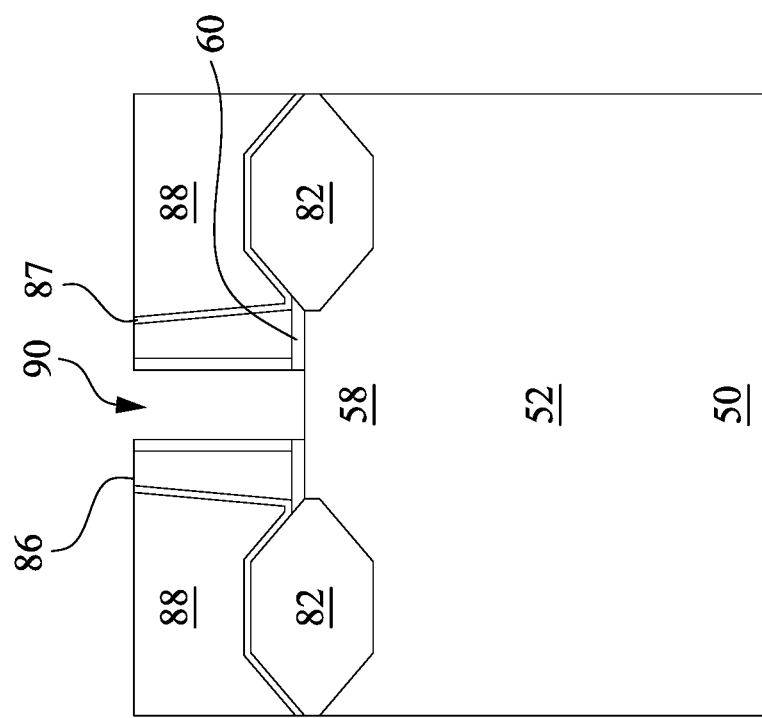
Figure 16A:
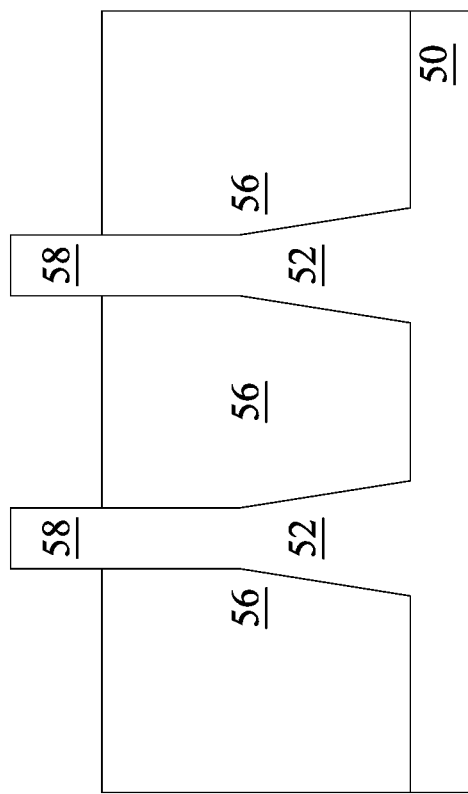

In FIGS. 16A and 16B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17C:
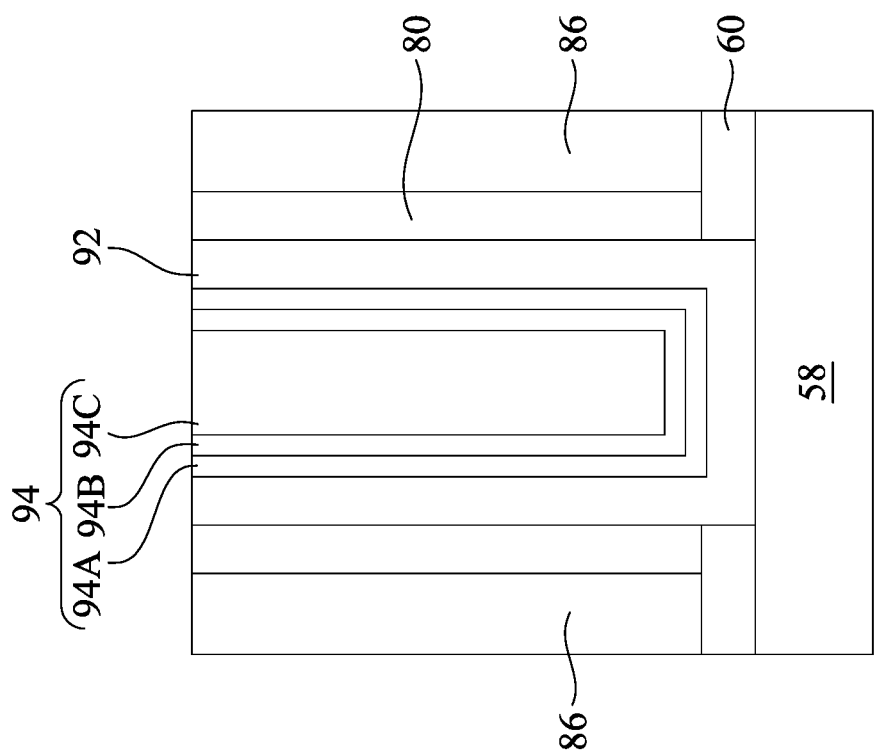

In FIGS. 17A and 17B, gate dielectric layers 92 and gate electrodes 94 are formed for replacement gates. FIG. 17C illustrates a detailed view of region 89 of FIG. 17B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
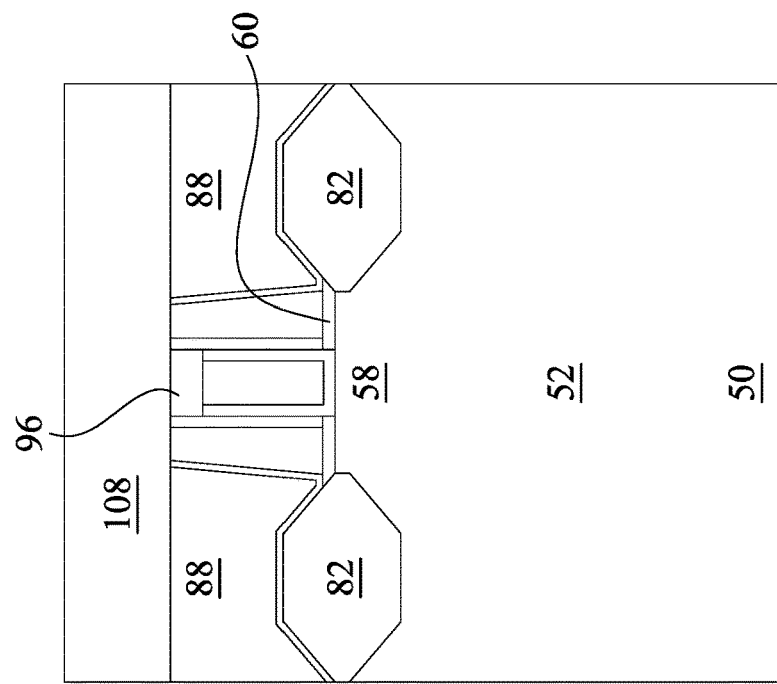
Figure 18A:
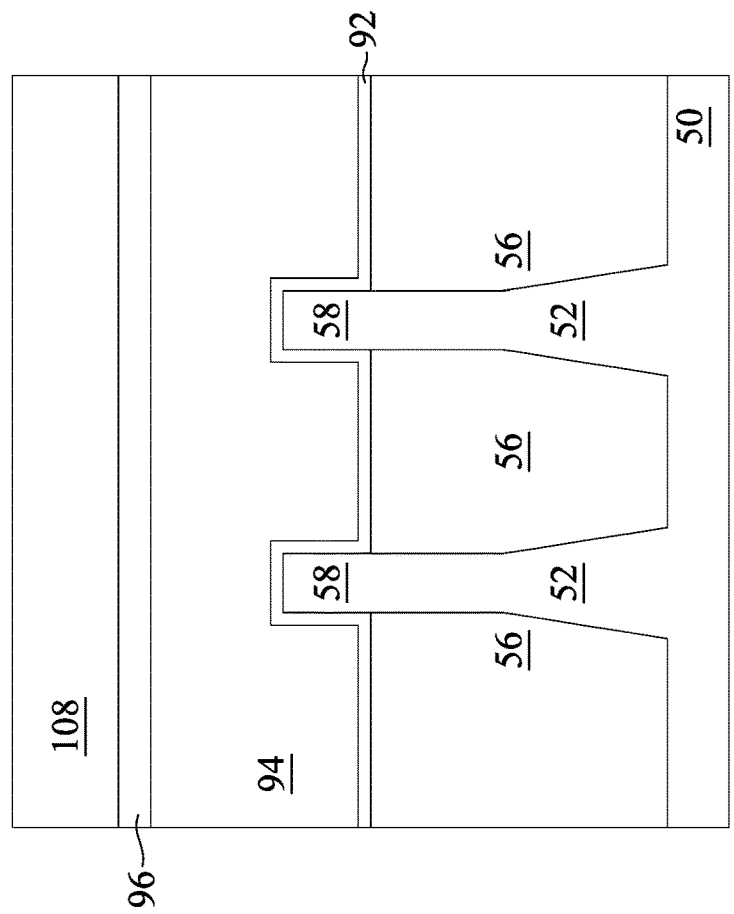

In FIGS. 18A and 18B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 19A and 19B) penetrate through the second ILD 108 and the gate mask 96 to contact the top surface of the recessed gate electrode 94.

Figure 19B:
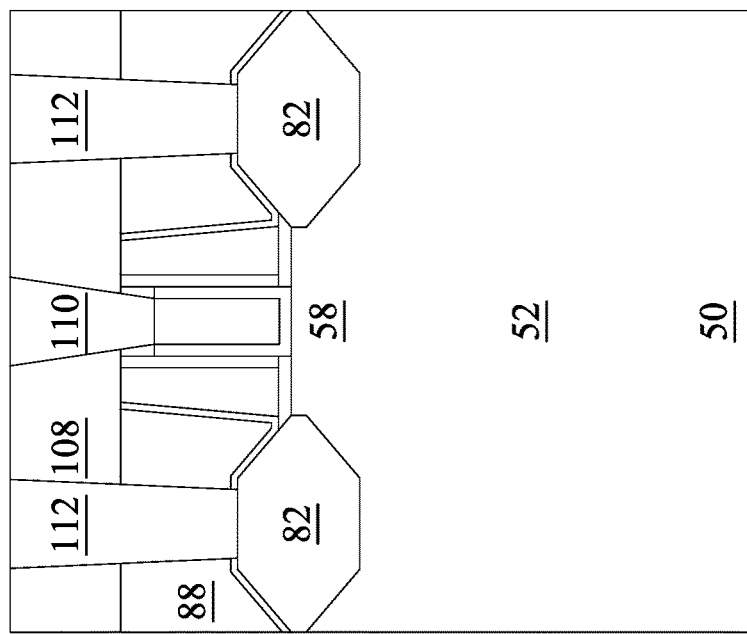
Figure 19A:
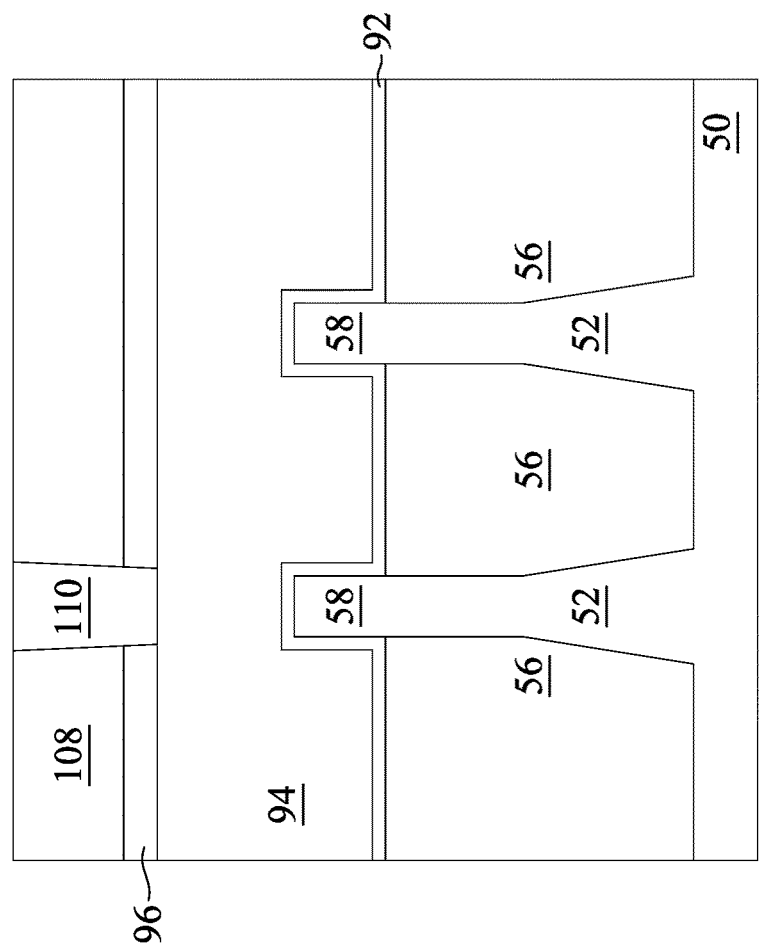

In FIGS. 19A and 19B, gate contacts no and source/drain contacts 112 are formed through the second ILD 108 and the first ILD 88 in accordance with some embodiments. Openings for the source/drain contacts 112 are formed through the first and second ILDs 88 and 108, and openings for the gate contact no are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts no in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts no are physically and electrically coupled to the gate electrodes 94. The source/drain contacts 112 and gate contacts no may be formed in different processes, or may be formed in the same process. Although shown as being formed in the same cross-sections, it should be appreciated that each of the source/drain contacts 112 and gate contacts no may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Various embodiments provide a method for filling a trench and the resulting structure. The trench may be filled with any suitable material, such as a low-k dielectric material, a metal oxide, a metal nitride, a pure metal, combinations thereof, or the like. Filling the trench may include one or more deposition and etch back depositing cycles. For example, a first material may be deposited in the trench using a conformal deposition process (e.g., chemical vapor deposition (CVD), atomic layer deposition (ALD), or the like) and the first material may be etched to a desired height. This deposition and etch-back process may be repeated until a desired configuration of materials is achieved. Due to the conformal deposition process, the first material may have a seam that is formed as regions of the first material are deposited on sidewalls of the trench and eventually merge. In some embodiments, the etch back process removes portions of the first material containing the seam. Various embodiments may provide for seam free deposition through ALD processes (e.g., thermal-based ALD, plasma-assisted ALD, or the like) without requiring a post deposition anneal, plasma bombardment, or using inhibitors, thereby reducing manufacturing defects.

In some embodiments, a method includes patterning a trench and depositing a first insulating material along sidewalls and a bottom surface of the trench using a conformal deposition process. Depositing the first insulating material includes forming a first seam between a first portion of the first insulating material on a first sidewall of the trench and a second portion of the first insulating material on a second sidewall of the trench. The method further includes etching the first insulating material below a top of the trench and depositing a second insulating material over the first insulating material and in the trench using a conformal deposition process. Depositing the second insulating material comprises forming a second seam between a first portion of the second insulating material on the first sidewall of the trench and a second portion of the second insulating material on a second sidewall of the trench. Optionally, in some embodiments, etching the first insulating material comprises removing the first seam. Optionally, in some embodiments, after etching the first insulating material, a portion of the first seam remains. Optionally, in some embodiments, depositing the first insulating material further comprises defining a void along the first seam. Optionally, in some embodiments, the first insulating material has a lower k value than the second insulating material. Optionally, in some embodiments, the second insulating material comprises a metal oxide or a metal nitride. Optionally, in some embodiments, the method further includes etching the second insulating material below a top of the trench; and depositing a third insulating material over the second insulating material and in the trench using a conformal deposition process, wherein depositing the third insulating material comprises forming a third seam between a first portion of the third insulating material on the first sidewall of the trench and a second portion of the third insulating material on a second sidewall of the trench. Optionally, in some embodiments, the method further includes etching the third insulating material below the top of the trench; depositing fourth insulating material over the third insulating material and in the trench; and planarizing the fourth insulating material. Optionally, in some embodiments, the third insulating material has a same material composition as the second insulating material.

In some embodiments, a method includes patterning a first trench and a second trench, wherein the first trench is wider than the second trench; depositing a first material in the first trench and the second trench; etching the first material in the first trench and the second trench; and depositing a second material over the first material in the first trench and the second trench, wherein depositing the second material forms a first seam in the first trench and a second seam in the second trench, and wherein the second seam extends lower than the first seam. Optionally, in some embodiments, the first material is an insulating material comprising $Si_xO_yC_zN_w$, wherein x, y, z, and w are each numbers greater than or equal to zero. Optionally, in some embodiments, the second material comprises a metal oxide or a metal nitride. Optionally, in some embodiments, etching the first material comprises removing a seam of the first material. Optionally, in some embodiments, the method further include etching the second material in the first trench and the second trench; and depositing a third material over the second material in the first trench and the second trench, wherein depositing the third material forms a third seam in the first trench and a fourth seam in the second trench, and wherein the fourth seam extends lower than the third seam. Optionally, in some embodiments, etching the second material removes the first seam and the second seam.

In some embodiments, a device includes a first fin; a second fin; a first insulating material between the first fin and the second fin; and a second insulating material between the first fin and the second fin and over the first insulating material, wherein the first insulating material has a lower k-value than the second insulating material, and wherein an interface between the first insulating material and the second insulating material is concave. Optionally, in some embodiments, the first insulating material is free of any seams. Optionally, in some embodiments, the first insulating material comprises a seam. Optionally, in some embodiments, the device further includes a third fin on an opposite side of the first fin as the second fin, wherein the first insulating material and the second insulating material are further disposed between the third fin and the first fin, and wherein the second insulating material further comprises: a third seam between the first fin and the second fin; and a fourth seam between the first fin and the third fin, wherein the fourth seam extends lower than the third seam. Optionally, in some embodiments, a distance between the first fin and the second fin is greater than a distance between the first fin and the third fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a trench;
    depositing a first insulating material along sidewalls and a bottom surface of the trench using a conformal deposition process, wherein depositing the first insulating material comprises forming a first seam between a first portion of the first insulating material on a first sidewall of the trench and a second portion of the first insulating material on a second sidewall of the trench;
    etching the first insulating material below a top of the trench; and
    after etching the first insulating material below the top of the trench, depositing a second insulating material over the first insulating material and in the trench using a conformal deposition process, wherein depositing the second insulating material comprises forming a second seam between a first portion of the second insulating material on the first sidewall of the trench and a second portion of the second insulating material on the second sidewall of the trench.

2. The method of claim 1, wherein etching the first insulating material comprises completely removing the first seam.

3. The method of claim 1, wherein after etching the first insulating material, a portion of the first seam remains.

4. The method of claim 1, wherein depositing the first insulating material further comprises defining a void along the first seam.

5. The method of claim 1, wherein the first insulating material has a lower k value than the second insulating material.

6. The method of claim 5, wherein the second insulating material comprises a metal oxide or a metal nitride.

7. The method of claim 1 further comprising:
    etching the second insulating material below the top of the trench; and
    depositing a third insulating material over the second insulating material and in the trench using a conformal deposition process, wherein depositing the third insulating material comprises forming a third seam between a first portion of the third insulating material on the first sidewall of the trench and a second portion of the third insulating material on the second sidewall of the trench.

8. The method of claim 7 further comprising:
    etching the third insulating material below the top of the trench;
    depositing a fourth insulating material over the third insulating material and in the trench; and
    planarizing the fourth insulating material.

9. The method of claim 8, wherein the third insulating material has a same material composition as the second insulating material.

10. A method comprising:
    patterning a first trench and a second trench, wherein the first trench is wider than the second trench;
    depositing a first material in the first trench and the second trench, wherein the first material is an insulating material comprising $Si_xO_yC_zN_w$, wherein x, y, z, and w are each numbers greater than or equal to zero;
    etching the first material in the first trench and the second trench; and
    depositing a second material over the first material in the first trench and the second trench, wherein depositing the second material forms a first seam in the first trench and a second seam in the second trench, and wherein the second seam extends lower than the first seam.

11. The method of claim 1, wherein the first insulating material comprises $Si_xO_yC_zN_w$, wherein x, y, z, and w are each numbers greater than or equal to zero.

12. The method of claim 10, wherein the second material comprises a metal oxide or a metal nitride.

13. The method of claim 10, wherein etching the first material comprises removing a seam of the first material.

14. The method of claim 10 further comprising:
    etching the second material in the first trench and the second trench; and
    depositing a third material over the second material in the first trench and the second trench, wherein depositing the third material forms a third seam in the first trench and a fourth seam in the second trench, and wherein the fourth seam extends lower than the third seam.

15. The method of claim 14, wherein etching the second material removes the first seam and the second seam.

16. A device comprising:
    a first fin;
    a second fin;
    a first insulating material between the first fin and the second fin; and
    a second insulating material between the first fin and the second fin and over the first insulating material, wherein the first insulating material has a lower k-value than the second insulating material, wherein an interface between the first insulating material and the second insulating material is concave, and wherein the interface between the first insulating material and the second insulating material extends continuously from a sidewall of the first fin to a sidewall of the second fin.

17. The device of claim 16, wherein the first insulating material is free of any seams.

18. The device of claim 16, wherein the first insulating material comprises a seam.

19. The device of claim 16, further comprising a third fin on an opposite side of the first fin as the second fin, wherein the first insulating material and the second insulating material are further disposed between the third fin and the first fin, and wherein the second insulating material further comprises:

a third seam between the first fin and the second fin; and a fourth seam between the first fin and the third fin, wherein the fourth seam extends lower than the third seam.

20. The device of claim 19, wherein a distance between the first fin and the second fin is greater than a distance between the first fin and the third fin.

* * * * *